(12) United States Patent
Sone et al.

(10) Patent No.: US 11,813,841 B2
(45) Date of Patent: Nov. 14, 2023

(54) WASHING DEVICE

(71) Applicant: FUJIFILM Corporation, Tokyo (JP)

(72) Inventors: Nobuyuki Sone, Haibara-gun (JP);
Manabu Hashigaya, Haibara-gun (JP);
Yusuke Ikeyama, Haibara-gun (JP);
Atsushi Oshima, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 17/508,287

(22) Filed: Oct. 22, 2021

(65) Prior Publication Data
US 2022/0040971 A1 Feb. 10, 2022

Related U.S. Application Data

(63) Continuation of application No. PCT/JP2020/015487, filed on Apr. 6, 2020.

(30) Foreign Application Priority Data

Apr. 24, 2019 (JP) .................. 2019-082795

(51) Int. Cl.
*G03F 7/30* (2006.01)
*B41F 35/00* (2006.01)

(52) U.S. Cl.
CPC .................. *B41F 35/001* (2013.01)

(58) Field of Classification Search
CPC ..... B41F 35/001; G03F 3/3057; G03F 7/3064
See application file for complete search history.

(56) References Cited

U.S. PATENT DOCUMENTS

| 5,552,262 | A | 9/1996 | Konermann |
| 2015/0234280 | A1 | 8/2015 | Arnold et al. |
| 2020/0192226 | A1 | 6/2020 | Shirakawa et al. |
| 2020/0198389 | A1* | 6/2020 | Shimanaka ........... B41C 1/1016 |

FOREIGN PATENT DOCUMENTS

| CA | 494054 A | 6/1953 |
| EP | 2 434 346 A2 | 3/2012 |

(Continued)

OTHER PUBLICATIONS

Extended European Search Report dated May 23, 2022 in European Application No. 20795541.0.

(Continued)

*Primary Examiner* — Christopher E Mahoney
*Assistant Examiner* — Marissa Ferguson-Samreth
(74) *Attorney, Agent, or Firm* — Sughrue Mion, PLLC

(57) ABSTRACT

Provided is a washing device that has a small device configuration, is excellent in maintainability, and further has a high productivity. The washing device performs development using a washing solution while transporting an imagewise exposed flexographic printing plate precursor. The washing device has a transporting unit that transports the flexographic printing plate precursor along a transport path having a curved transport passage and a linear transport passage, using a leader and a developing portion that performs development by removing an unexposed portion of the flexographic printing plate precursor. The transporting unit transports the flexographic printing plate precursor using a winding transmission method or transports the flexographic printing plate precursor using a method of winding a traction member provided at the leader.

17 Claims, 15 Drawing Sheets

(56) References Cited

FOREIGN PATENT DOCUMENTS

| JP | 6-92492 A | | 4/1994 |
|---|---|---|---|
| JP | 0692492 | * | 4/1994 |
| JP | 6-214401 A | | 8/1994 |
| JP | 7-271111 A | | 10/1995 |
| JP | 8-286388 A | | 11/1996 |
| JP | 2002-311599 A | | 10/2002 |
| JP | 2004-090399 A | | 3/2004 |
| JP | 2005-266467 A | | 9/2005 |
| JP | 2010-083058 A | | 4/2010 |
| JP | 2010083058 A | * | 4/2010 |
| JP | 2010197620 | * | 9/2010 |
| JP | 2015-114558 A | | 6/2015 |
| JP | 2016-133641 A | | 7/2016 |
| JP | 2016133641 | * | 7/2016 |
| JP | 2017-512146 A | | 5/2017 |
| WO | 2019/044319 A1 | | 3/2019 |
| WO | WO-2019044319 | * | 1/2021 |

OTHER PUBLICATIONS

International Search Report dated Jun. 9, 2020, issued by the International Searching Authority in application No. PCT/JP2020/015487.
Written Opinion dated Jun. 9, 2020, issued by the International Searching Authority in application No. PCT/JP2020/015487.
International Preliminary Report on Patentability dated Sep. 28, 2021, issued by the International Bureau in application No. PCT/JP2020/015487.

* cited by examiner

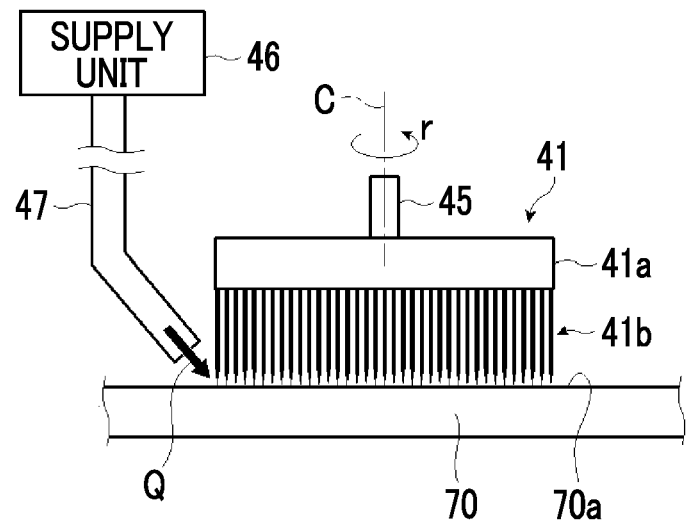
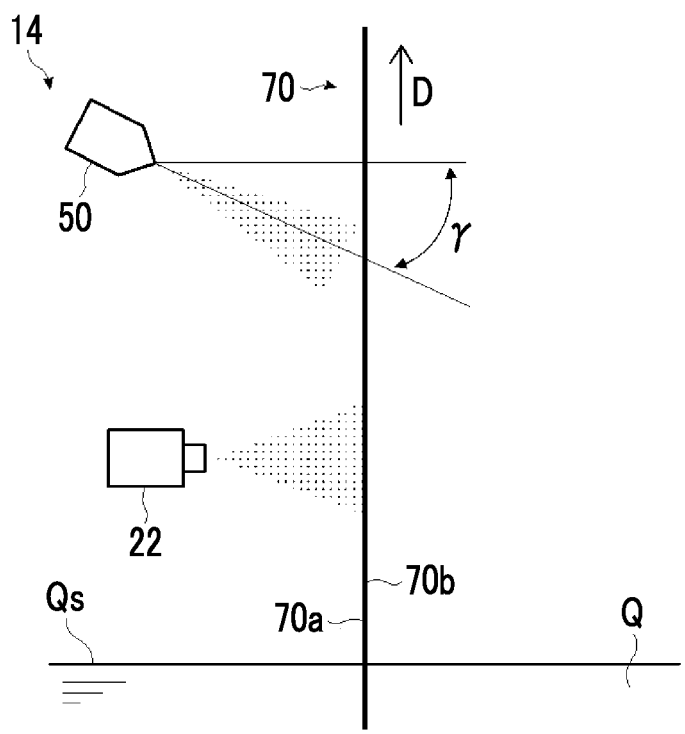
FIG. 18

WASHING DEVICE

CROSS-REFERENCE TO RELATED APPLICATIONS

This application is a Continuation of PCT International Application No. PCT/JP2020/015487 filed on Apr. 6, 2020, which claims priority under 35 U.S.C. § 119(a) to Japanese Patent Application No. 2019-082795 filed on Apr. 24, 2019. The above application is hereby expressly incorporated by reference, in its entirety, into the present application.

BACKGROUND OF THE INVENTION

1. Field of the Invention

The present invention relates to a washing device that develops an imagewise exposed flexographic printing plate precursor using a washing solution, and particularly relates to a washing device that performs development in a state where the flexographic printing plate precursor is immersed in the washing solution and is transported.

2. Description of the Related Art

Various methods are known as a developing method for a printing plate formed of a photosensitive resin plate. For example, in a developing method of performing development using an aqueous developer of which a main component is water, development is performed by applying the aqueous developer to an imagewise exposed photosensitive resin plate with a brush or the like and washing out an uncured resin or the like, which is an unexposed portion.

For example, in JP2017-512146A, an original plate is attached to a drum and is developed using a stretching leader.

In addition, in a developing device of JP2002-311599A, development is performed with a rotating brush by mounting a photosensitive resin letterpress, on which a relief image is formed through exposure, on a rotating drum and rotating the drum while jetting a developer to a printing plate surface at a high pressure, and the developer on the photosensitive resin plate is washed away while continuing the rotation of the brush.

SUMMARY OF THE INVENTION

In a developing device that performs development in a state where a plate material is attached to a drum as in JP2017-512146A and JP2002-311599A, the size of the drum depends on the size of the plate material to be developed. For this reason, in order to develop a large plate material, it is necessary to make the circumference of the drum long, and as a result, it is necessary to make the diameter of the drum large. In a case where the drum is large, a large amount of power is necessary to drive the drum as well, a motor to be driven or the like also becomes large, and the developing device becomes large.

In addition, the developing device formed of the drum has a complicated device configuration for controlling the rotation of the drum, such as stopping the drum at a determined rotational position, leading to poor maintainability.

In addition, in the developing device formed of the drum, development is performed with the brush or the like in a state where the plate material is bent along the circumferential surface of the drum. In this case, since the plate material is bent, the entire brush is unlikely to come into contact with the plate material, the efficiency of development is low, and the productivity is low.

An object of the present invention is to provide a washing device that solves the problems based on the related art described above, has a small device configuration, is excellent in maintainability, and further has a high productivity.

According to an aspect of the present invention, in order to achieve the object described above, there is provided a washing device that performs development using a washing solution while transporting an imagewise exposed flexographic printing plate precursor. The washing device comprises a transporting unit that transports the flexographic printing plate precursor along a transport path having a curved transport passage and a linear transport passage, using a leader, and a developing portion that performs the development by removing an unexposed portion of the flexographic printing plate precursor. The transporting unit transports the flexographic printing plate precursor using a winding transmission method or transports the flexographic printing plate precursor using a method of winding a traction member provided at the leader.

It is preferable that the leader is provided, among a front end of the flexographic printing plate precursor on a traveling direction side and a rear end on an opposite side of the front end, at least the front end.

It is preferable that the leader is provided, among a front end part of a support where the flexographic printing plate precursor is provided on a traveling direction side and a rear end part on an opposite side of the front end part, at least the front end part.

It is preferable that the leader is provided at each of the front end part of the support and the rear end part of the support.

It is preferable that the transporting unit uses a pair of transport chains or a pair of transport belts disposed parallel to each other, fixes the leader to the transport chains or the transport belts, and transports the flexographic printing plate precursor.

It is preferable that the leader has a leader mechanism that expands and contracts in a traveling direction of the flexographic printing plate precursor.

It is preferable that the leader is fixed to the transport chains or the transport belts through at least one method of fixing methods using hooking, screwing, sandwiching, or a magnetic force.

It is preferable that the transporting unit has a tension adjusting unit that adjusts tension of the flexographic printing plate precursor during transporting.

It is preferable that a guide unit that is in contact with the flexographic printing plate precursor is provided at the curved transport passage, and it is preferable that at least a surface of the guide unit, which is in contact with the flexographic printing plate precursor, is composed of a resin layer, a plating layer, or a diamond-like carbon layer or is formed of a plurality of uneven portions.

It is preferable that a back plate portion that is in contact with the flexographic printing plate precursor is provided at the linear transport passage, and a surface of the back plate portion, which is in contact with the flexographic printing plate precursor, is a plane.

It is preferable that the transporting unit has a guide mechanism that guides the transport chains.

It is preferable that the developing portion performs development by immersing the flexographic printing plate precursor in the washing solution or supplying the washing solution to the flexographic printing plate precursor.

It is preferable that the washing solution is an aqueous developer.

It is preferable that the washing device further comprises a rinsing unit that is provided on a downstream side of the developing portion in a traveling direction of the flexographic printing plate precursor, and it is preferable that the rinsing unit supplies at least the washing solution to a surface of the flexographic printing plate precursor from which the unexposed portion of the flexographic printing plate precursor is removed.

The rinsing unit may supply the washing solution to a back surface of the flexographic printing plate precursor.

It is preferable that the rinsing unit has a nozzle that is for supplying the washing solution and a liquid drain nozzle that is provided on the traveling direction side of the flexographic printing plate precursor from the nozzle, and removes the washing solution supplied from the nozzle by jetting or sucking a gas.

With the present invention, it is possible to provide a washing device that has a small device configuration, is excellent in maintainability, and further has a high productivity.

BRIEF DESCRIPTION OF THE DRAWINGS

FIG. 17 is a schematic view showing an example of a supply form of a washing solution of the washing device of the embodiment of the present invention.

FIG. 18 is a schematic view showing a first example of a rinsing unit of the washing device of the embodiment of the present invention.

DESCRIPTION OF THE PREFERRED EMBODIMENTS

Hereinafter, a washing device according to an embodiment of the present invention will be described in detail based on suitable embodiments shown in the accompanying drawings.

The drawings to be described below are exemplary for describing the present invention, and the present invention is not limited to the drawings shown below.

In the following, "to" indicating a numerical range includes numerical values described on both sides. For example, in a case where ε is a numerical value α to a numerical value β, the range of ε is a range including the numerical value α and the numerical value β, and is $\alpha \leq \varepsilon \leq \beta$ in mathematical symbols.

In addition, "orthogonal" and a particular angle include a range of errors generally acceptable in the corresponding technical field unless particularly stated otherwise. Further, a numerical value or the like includes a range of errors generally acceptable in the corresponding technical field unless particularly stated otherwise.

(Washing Device)

Figure 1:
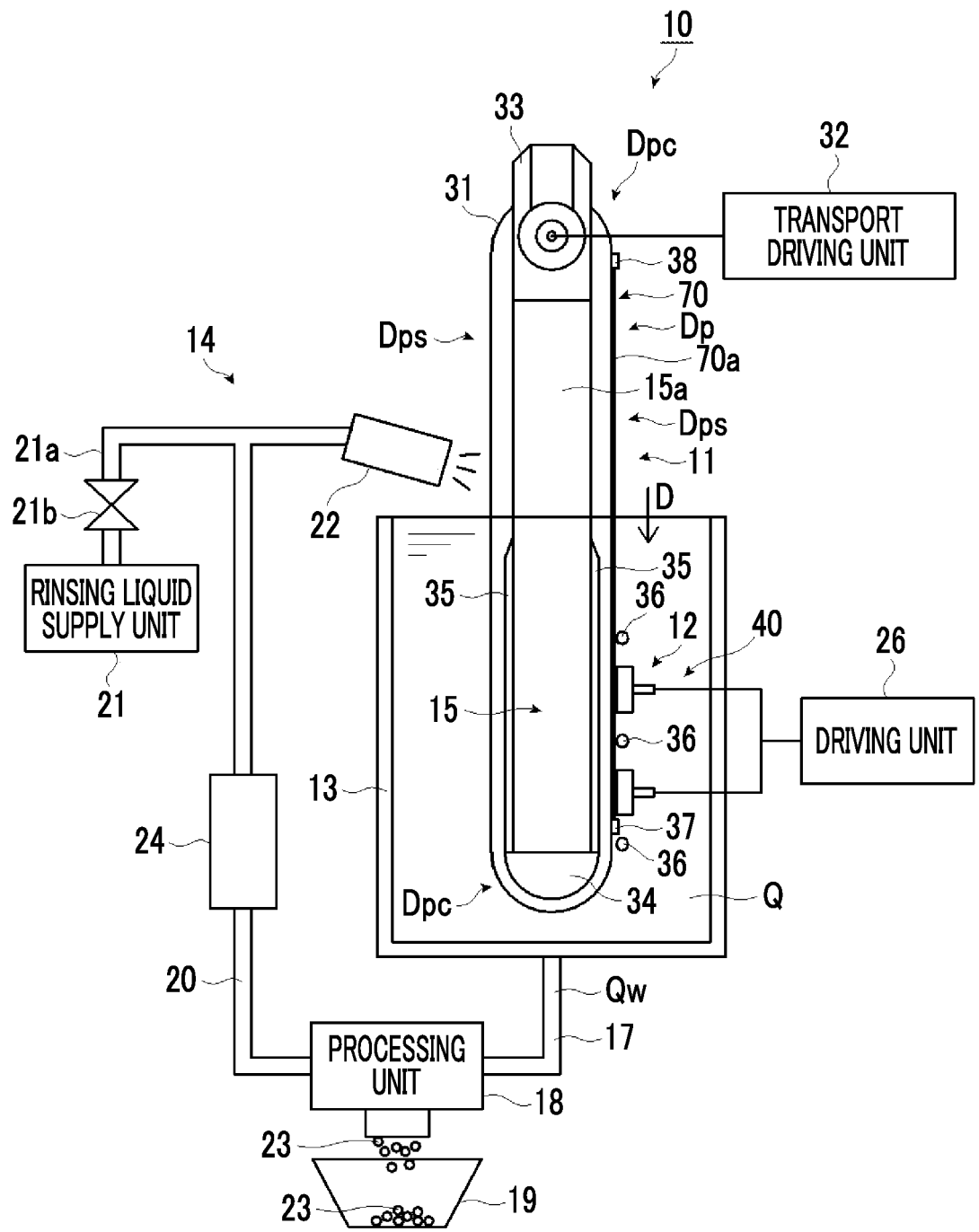
FIG. 1 is a schematic side view showing an example of a washing device of an embodiment of the present invention.
Figure 2:
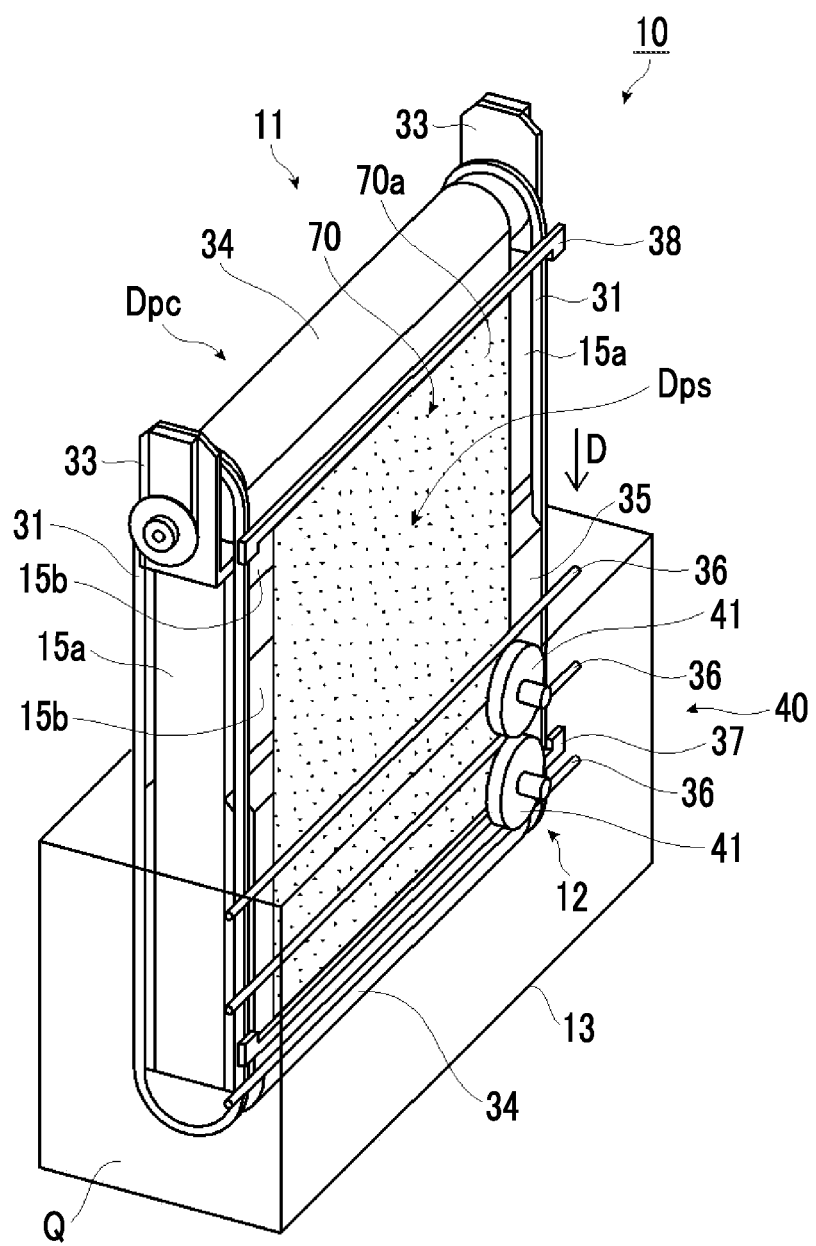
FIG. 2 is a schematic perspective view showing main portions of the example of the washing device of the embodiment of the present invention.
Figure 3:
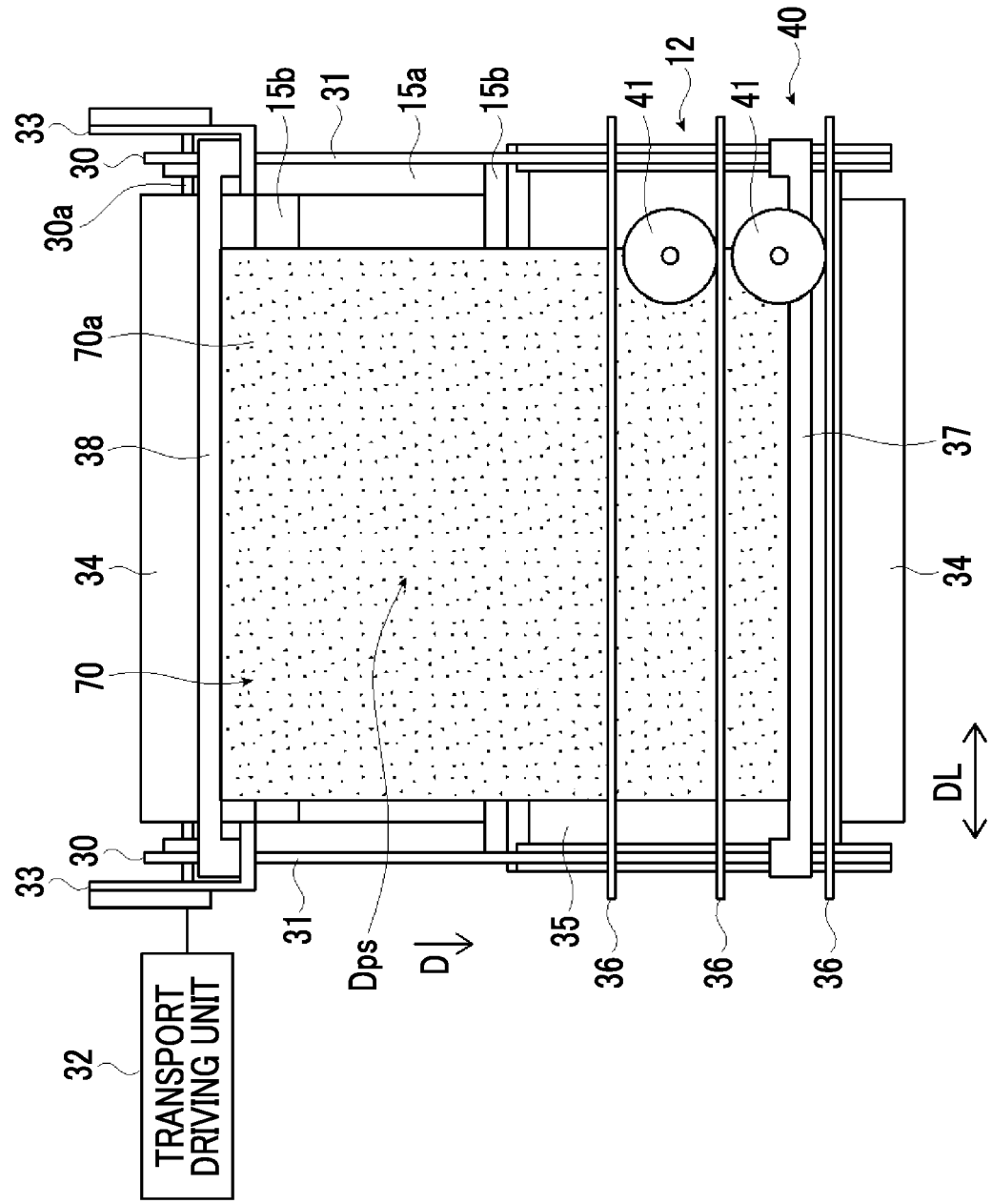
FIG. 3 is a schematic plan view showing the main portions of the example of the washing device of the embodiment of the present invention.

FIG. 1 is a schematic side view showing an example of the washing device of the embodiment of the present invention, FIG. 2 is a schematic perspective view showing main portions of an example of the washing device of the embodiment of the present invention, and FIG. 3 is a schematic plan view showing main portions of an example of the washing device of the embodiment of the present invention.

A washing device 10 shown in FIG. 1 is a device that develops an imagewise exposed flexographic printing plate precursor 70, of which a front surface 70a is imagewise exposed, using a washing solution Q while transporting the flexographic printing plate precursor and is a transporting type washing device that develops the flexographic printing plate precursor 70 in a state of being transported along a determined transport path Dp. Performing development using the washing solution Q described above is called a developing step. As shown in FIG. 1, the transport path Dp for the flexographic printing plate precursor 70 has a curved transport passage Dpc and linear transport passages Dps. The transport path Dp shown in FIG. 1 is a go-around transport path having the curved transport passage Dpc, the linear transport passage Dps, and the curved transport passage Dpc. For this reason, as will be described later, the flexographic printing plate precursor 70 can be developed by making the flexographic printing plate precursor go around a plurality of times.

As will be described later, the flexographic printing plate precursor 70 has a small thickness of approximately several millimeters, and is flexible enough to be curved and transported in a developing tank 13. In addition, for example, an exposure device (not shown) imagewise exposes the front surface 70a of the flexographic printing plate precursor 70. The imagewise exposed front surface 70a of the flexographic printing plate precursor 70 becomes a printing surface.

In the washing device 10, the imagewise exposed flexographic printing plate precursor 70, which is in a state of being immersed in the washing solution Q and being transported, is developed with an unexposed portion (not shown) of the flexographic printing plate precursor 70 removed. The washing device 10 is a single-sheet type device that performs development while transporting the flexographic printing plate precursor 70 along a determined transport path instead of performing development through batch processing. In a washing method using the washing device 10, the flexographic printing plate precursor 70 is developed while being transported along the determined transport path Dp. The washing method means a developing method.

While transporting the flexographic printing plate precursor 70 described above and a state where the flexographic printing plate precursor 70 is transported mean moving the flexographic printing plate precursor 70 along the transport path Dp.

The washing device 10 has a transporting unit 11, a developing portion 12, and a rinsing unit 14.

Although the transporting unit 11 and the developing portion 12 are provided at a frame 15 in the washing device 10, the invention is not limited to the configuration.

The outer shape of the frame 15 is, for example, a rectangular shape. Two members 15a of the frame 15 extending in one direction as shown in FIG. 2 are disposed in parallel. In a direction orthogonal to a longitudinal direction of the members 15a, beam members 15b are disposed at both ends and the center of the members 15a in the longitudinal direction. Between the beam members 15b provided at both ends of the member 15a of the frame 15 in the longitudinal direction is the linear transport passage Dps. For example, up to the center of the members 15a of the frame 15, that is, up to the beam member 15b at the center is disposed in the developing tank 13. The developing tank 13 is a container in which the washing solution Q is stored. The developing portion 12 is disposed in the linear transport passage Dps in the developing tank 13.

As shown in FIG. 3, for example, gears 30 are rotatably provided at both ends of each member 15a in the longitudinal direction. The gears 30 facing each other in a longitudinal direction of the beam members 15b are connected by a shaft 30a. In each member 15a, a transport chain 31 is hung on a pair of gears 30 facing each other in the longitudinal direction. A pair of transport chains 31 are disposed to face each other in the longitudinal direction of the beam members 15b of the frame 15.

For example, a transport driving unit 32 is connected to one of a plurality of gears 30. The gears 30 are rotated by the transport driving unit 32, and the transport chains 31 move in a specific direction. A method of connecting between the gears 30 and the transport driving unit 32 is not particularly limited, the gears and the transport driving unit may be connected to each other by a shaft or the like, or may be connected to each other using a chain or a belt.

The transporting unit 11 is composed of the gears 30, the transport chains 31, and the transport driving unit 32. The flexographic printing plate precursor 70 is transported by the transporting unit 11 in a state of being immersed in the washing solution Q in the developing tank 13.

The transporting unit 11 preferably has a tension adjusting unit 33 (see FIG. 1) that adjusts the tension of the flexographic printing plate precursor 70 during transporting. In a case where the tension of the transport chain 31 is low, the tension of the flexographic printing plate precursor 70 during transporting is low, the flexographic printing plate precursor 70 is loosened during transporting, and the flexographic printing plate precursor 70 is not stably transported. In addition, in a case where the tension of the transport chain 31 is low, the transport chain 31 is disengaged from the gear 30 in some cases. For this reason, the tension adjusting unit 33 that adjusts the tension of the transport chain 31 is provided at an end part of the member 15a in order to adjust the tension of the flexographic printing plate precursor 70 during transporting. The tension of the flexographic printing plate precursor 70 during transporting can be adjusted by the tension adjusting unit 33, and the flexographic printing plate precursor 70 is prevented from being loosened during transporting.

Insofar as the tension of the flexographic printing plate precursor 70 during transporting can be adjusted, a position where the tension adjusting unit 33 is disposed and a configuration thereof are not particularly limited, and a known unit can be used as appropriate. For example, it is possible to use a unit that changes a distance between the gears 30 on which the transport chains 31 are hung, a unit that applies tension by pressing the gears against the transport chain 31, or the like as appropriate.

The transporting unit 11 may have a guide mechanism that guides the transport chain 31. The guide mechanism can prevent meandering of the transport chain 31 or the like. The guide mechanism is composed of, for example, a member that is provided on an opposite side of the transport chain 31 where the flexographic printing plate precursor 70 is disposed and is inserted between rollers (not shown) of the transport chains 31. This member is formed of, for example, high molecular weight polyethylene or a fluororesin such as polytetrafluoroethylene (PTFE).

A guide unit 34 (see FIG. 2) is provided at each of the beam members 15b at ends of each member 15a in the longitudinal direction. The guide unit 34 is composed of a semi-cylindrical member, and the semi-cylindrical member is provided with a plane portion facing a beam member 15b side.

The curved transport passage Dpc is composed of the semi-cylindrical guide unit 34, and the flexographic printing plate precursor 70 is transported along the surface of the guide unit 34. In this case, a back surface 70b of the flexographic printing plate precursor 70 is in contact with the guide unit 34. The guide unit 34 is composed of a semi-cylindrical member having a size corresponding to the curvature of the curved transport passage Dpc or the like.

Since the guide unit 34 is in contact with the flexographic printing plate precursor 70, at least, a surface in contact with the flexographic printing plate precursor 70 preferably has a low frictional resistance. As the frictional resistance is low, the flexographic printing plate precursor 70 can be smoothly transported without damaging the back surface 70b. The guide unit 34 prevents tension fluctuations in the curved transport passage Dpc during transporting the flexographic printing plate precursor 70.

In addition, a back plate portion 35 with which the flexographic printing plate precursor is in contact is provided between the beam member 15b at the center of the member 15a of the frame 15 and the beam member 15b at the end.

Since the back plate portion 35 is in contact with the flexographic printing plate precursor 70, a surface in contact with the flexographic printing plate precursor 70 is preferably a plane. As the surface in contact with the flexographic printing plate precursor 70 is a plane, the flexographic printing plate precursor 70 can be efficiently washed.

The back plate portion 35 is formed of, for example, a metal. The metal is preferably stainless steel, titanium, or the like, the back plate portion 35 may be plated on the surface in contact with the flexographic printing plate precursor 70, and the plating is preferably hard chrome plating, and is more preferably diamond-like carbon (DLC) processing. In addition thereto, surface treatment with titanium nitride (TiN) or the like may be performed on the surface in contact with the flexographic printing plate precursor 70.

The surface of the guide unit 34, which is in contact with the flexographic printing plate precursor 70, is composed of, for example, a resin layer, a plating layer, or a diamond-like carbon (DLC) layer. The resin layer can be formed of a fluororesin, such as polytetrafluoroethylene (PTFE) and high-density polyethylene. The plating layer is, for example, hard chrome plating. In addition thereto, a titanium nitride (TiN) layer or the like can be used. Further, a nonwoven fabric can also be used for the guide unit 34. In a case of using the nonwoven fabric, an attachment on the back surface 70b of the flexographic printing plate precursor 70 can be removed.

In addition, a plurality of uneven portions may be formed in the surface of the guide unit 34, which is in contact with the flexographic printing plate precursor 70. As the plurality of uneven portions are formed, a contact area decreases and a frictional resistance decreases. An example in which the plurality of uneven portions are formed includes a metal plate such as an embossed stainless steel plate.

The guide unit 34 may be entirely formed of a material forming the surface in contact with the flexographic printing plate precursor 70.

Since the guide unit 34 is used in a state of being immersed in the washing solution Q in some cases, a unit that does not dissolve in the washing solution Q, a unit that does not deteriorate due to the washing solution Q, or a unit that does not deform, such as swelling, due to the washing solution Q is preferable.

In addition, for example, three nip rollers 36 are provided to face the back plate portion 35 at intervals in the longitudinal direction of the member 15a. Two of the three nip rollers are provided near a brush 41 of the developing portion 12. Although the flexographic printing plate precursor 70 has flexibility as described above, the nip rollers 36 prevent deflection or the like during transporting so that the flexographic printing plate precursor 70 can be stably transported and the flexographic printing plate precursor 70 can be stably transported even in a case where the brush 41 rotates or moves particularly during development. The nip rollers 36 are not limited to three.

In order not to damage the printing surface, that is, the front surface 70a of the flexographic printing plate precursor 70, for example, rubber rollers, sponge rollers, rotary brushes, or the like are preferably used as the nip rollers 36.

Since the flexographic printing plate precursor 70 has flexibility as described above, there is a possibility that the unexposed portion cannot be efficiently removed by the brush 41 due to deflection or the like in a case of being rubbed against the brush 41. As the back plate portion 35 described above is provided, the back surface 70b of the flexographic printing plate precursor 70 is supported by the back plate portion 35 in a case of removing the unexposed portion by the brush 41, so that the unexposed portion can be efficiently removed. In addition, the back plate portion 35 functions as a transport guide, and thus the flexographic printing plate precursor 70 can be more stably transported by the back plate portion 35.

Figure 4:
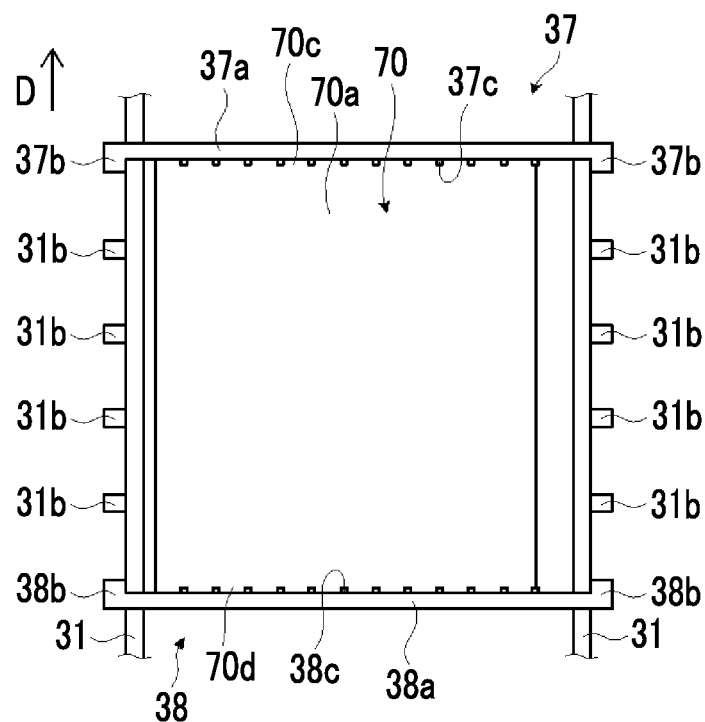
FIG. 4 is a schematic plan view showing a transporting form of a flexographic printing plate precursor of the embodiment of the present invention.
Figure 5:
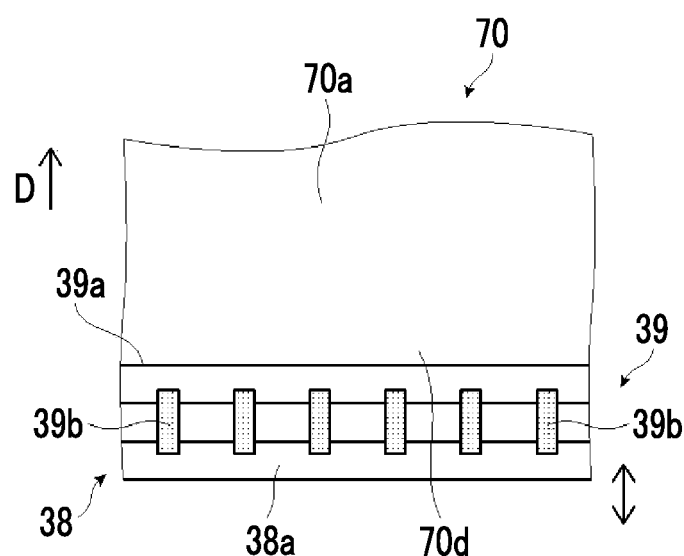
FIG. 5 is a schematic view showing a leader mechanism used in transporting the flexographic printing plate precursor of the embodiment of the present invention.

Herein, FIG. 4 is a schematic plan view showing a transporting form of the flexographic printing plate precursor of the embodiment of the present invention, and FIG. 5 is a schematic view showing a leader mechanism used in transporting the flexographic printing plate precursor of the embodiment of the present invention. In addition, FIG. 6 is a schematic plan view showing another example of the transporting form of the flexographic printing plate precursor of the embodiment of the present invention.

The transporting unit 11 fixes a leader to a pair of transport chains 31 and transports the flexographic printing plate precursor 70.

The leader is provided at least on a traveling direction side of the flexographic printing plate precursor 70, that is, a front end 70c (see FIG. 4) of the front end 70c (see FIG. 4) on a transport direction D side or a rear end 70d (see FIG. 4) on an opposite side of the front end 70c (see FIG. 4). In addition, the leader is provided at least on a traveling direction side of a support 48 (see FIG. 6) where the flexographic printing plate precursor 70 is provided, that is, at least a front end part 48a (see FIG. 6) of the front end part 48a (see FIG. 6) on the transport direction D side or a rear end part 48b (see FIG. 6) on an opposite side of the front end pan 48a (see FIG. 6).

Figure 6:
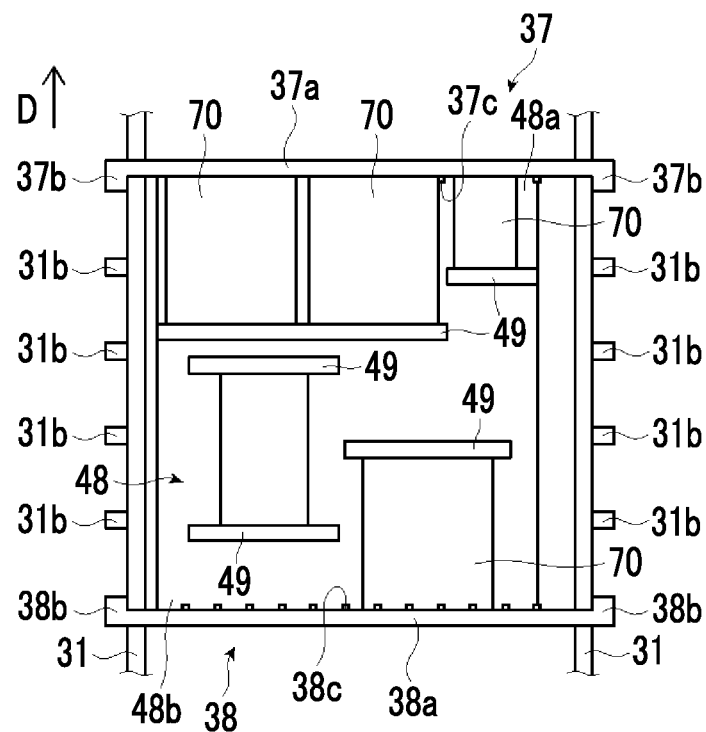
FIG. 6 is a schematic plan view showing another example of the transporting form of the flexographic printing plate precursor of the embodiment of the present invention.

The leader includes a front end leader 37 and a rear end leader 38 shown in FIGS. 4 and 6.

As shown in FIGS. 4 and 6, for example, a plurality of fixing units 31b are provided on the transport chain 31 at equal intervals along a longitudinal direction of the transport chain 31. The front end leader 37 and the rear end leader 38 are fixed to the fixing units 31b. The longitudinal direction of the transport chain 31 is the same direction as a transport direction D.

As shown in FIG. 4, the front end leader 37 has a long base 37a and a bending portion 37b provided at each end of the base 37a in the longitudinal direction. Pins 37c are provided on the base 37a at equal intervals along the longitudinal direction. The pins 37c are made to penetrate the flexographic printing plate precursor 70 or the support 48, the base 37a and the front end of the flexographic printing plate precursor 70 or the front end part of the support 48 are combined with each other, and the front end leader 37 is fixed to the flexographic printing plate precursor 70 or the support 48.

The bending portion 37b of the front end leader 37 is fixed to the fixing unit 31b of the transport chain 31, and the front end leader 37 is fixed to the transport chain 31. A method of fixing the front end leader 37 to the transport chain 31 is not particularly limited, and the front end leader is fixed to the transport chain through at least one method of fixing methods using hooking, screwing, sandwiching, or a magnetic force.

The hooking is, for example, a method of hooking the bending portion 37b to the fixing unit 31b.

The screwing is, for example, a method of fixing the bending portion 37b to the fixing unit 31b using a bolt and a nut. In addition thereto, a method of forming a female thread in the fixing unit 31b and fixing the bending portion 37b to the fixing unit 31b using a screw is also included in screwing.

The sandwiching is, for example, a method of collectively sandwiching and fixing the bending portion 37b and the fixing unit 31b to each other using a member such as a clip.

Fixing by a magnetic force is, for example, a method of forming the bending portion 37b and the fixing unit 31b by magnetic materials and fixing the bending portion 37b and the fixing unit 31b to each other using a magnet.

The rear end leader 38 has basically the same configuration as the front end leader 37 described above. The rear end leader 38 has a long base 38a and a bending portion 38b provided at each end of the base 38a in the longitudinal direction. Pins 38c are provided on the base 38a at equal intervals along the longitudinal direction. The pins 38c are made to penetrate the flexographic printing plate precursor 70 or the support 48, the base 38a and the rear end of the flexographic printing plate precursor 70 or the rear end part of the support 48 are combined with each other, and the rear end leader 38 is fixed to the flexographic printing plate precursor 70 or the support 48.

The bending portion 38b of the rear end leader 38 is fixed to the fixing unit 31b of the transport chain 31, and the rear end leader 38 is fixed to the transport chain 31. A method of fixing the rear end leader 38 to the transport chain 31 is not particularly limited, and the rear end leader is fixed to the transport chain through at least one method of fixing methods using hooking, screwing, sandwiching, or a magnetic force, like the front end leader 37.

Since the front end leader 37 is on the traveling direction side, a force acts on a direction in which the fixing unit 31b presses the bending portion 37b of the front end leader 37 even in a case of being hooked. In order to make a force act in the direction in which the bending portion 37b is pressed, it is necessary to hook the bending portion 38b of the rear end leader 38 in an opposite direction to the front end leader 37. For this reason, fixing methods using screwing, sandwiching, and a magnetic force, which allow fixing in states of FIGS. 4 and 6, are preferable for the rear end leader 38.

In addition, transporting tension fluctuates in some cases due to fluctuations of transporting during transporting. Transporting becomes unstable due to the fluctuations of the transporting tension. In addition, the flexographic printing plate precursor 70 expands and contracts in some cases due to the transporting tension during transporting. For this reason, it is preferable to prevent the fluctuations of the transporting tension and effects of expansion and contraction or the like of the flexographic printing plate precursor 70. Thus, it is preferable for a leader to have a leader mechanism 39 that expands and contracts with respect to the traveling direction of the flexographic printing plate precursor 70. The leader mechanism 39 can reduce the fluctuations of the transporting tension and the effects of expansion and contraction or the like of the flexographic printing plate precursor 70 by expanding and contracting with respect to the traveling direction of the flexographic printing plate precursor 70.

Since the front end leader 37 is on the traveling direction side, transporting tension is unlikely to fluctuate, but the transporting tension of the rear end leader 38 is likely to fluctuate. For this reason, it is preferable for the rear end leader 38 to have the leader mechanism 39 (see FIG. 5).

For example, as shown in FIG. 5, the leader mechanism 39 is provided between the base 38a and the flexographic printing plate precursor 70. The leader mechanism 39 has a frame material 39a and an elastic member 39b such as a spring and rubber, and the frame material 39a and the base 38a are disposed in parallel with each other and are connected to each other by the elastic member 39b. In a case where the leader mechanism 39 is provided, the pins 38c are not provided on the base 38a, and the pins 38c (see FIG. 4) are provided on the frame material 39a. The frame material 39a is fixed to the flexographic printing plate precursor 70.

The front end leader 37 may be configured to have the leader mechanism 39. In this case, the leader mechanism 39 is provided at the base 37a.

The washing device 10 is not limited to a form in which the front end leader 37 and the rear end leader 38 are attached to the flexographic printing plate precursor 70 described above, a form in which the flexographic printing plate precursor 70 is provided at the support 48 and the front end leader 37 and the rear end leader 38 are attached to the support 48 as shown in FIG. 6 may be adopted. In this case, a plurality of flexographic printing plate precursors 70 are provided, but the flexographic printing plate precursors 70 may be fixed to the front end leader 37 together with the support 48, or the flexographic printing plate precursors 70 may be fixed to the rear end leader 38 together with the support 48. An end part of the flexographic printing plate precursor 70, which is not fixed to the front end leader 37 or the rear end leader 38, is fixed to the support 48, for example, using tape 49.

In addition, the flexographic printing plate precursor 70 may be fixed to the support 48 only with the tape 49.

Since the support 48 is transported instead of the flexographic printing plate precursor 70, the support preferably has approximately the same flexibility, strength, and the like as the flexographic printing plate precursor 70. The support 48 is formed of, for example, a stainless steel plate, a polyethylene (PET) material, or the like.

Although the front end leader 37 and the rear end leader 38 fix the flexographic printing plate precursor 70 using the pins 37c and 38c as described above, the shapes, numbers, and disposition intervals of the pins 37c and 38c are not particularly limited. Although the fixing of the flexographic printing plate precursor 70 is not limited to using the pins 37c and 38c, it is preferable that no residue or the like is generated during fixing.

In the washing device 10, the developing portion 12 and the rinsing unit 14 are provided along the transport path Dp for the flexographic printing plate precursor 70. For example, the developing portion 12 is provided in the developing tank 13, and the rinsing unit 14 is provided at an upper portion of the developing tank 13 where the flexographic printing plate precursor 70 that has gone through the developing portion 12 first comes out. Further, the washing device 10 has a processing unit 18 provided at the developing tank 13 via a connecting pipe 17. In the washing device 10, for example, the flexographic printing plate precursor 70 that has gone through the rinsing unit 14 is taken out. A position where the flexographic printing plate precursor 70 is taken out in the washing device 10 is not particularly limited.

(Transporting Unit)

In the transporting unit 11, the gear 30 is rotated by the transport driving unit 32, and the flexographic printing plate precursor 70 fixed to the transport chain 31 using the front end leader 37 and the rear end leader 38 moves the vicinity of the frame 15. The transport path Dp for the flexographic printing plate precursor 70 is a path for going around the vicinity of the frame 15, and has the curved transport passage Dpc and the linear transport passage Dps.

In the washing device 10, for example, after one time of development, processing by the rinsing unit 14 is performed and ended. However, development is not limited to one time, and the flexographic printing plate precursor may go around the vicinity of the frame 15 a plurality of times in order to perform development a plurality of times.

Although there are various transport paths such as a one-direction transport path, a reciprocating transport path, and a go-around transport path as the transport path Dp for the flexographic printing plate precursor 70, it is preferable that the transport path Dp for the flexographic printing plate precursor 70 is the one-direction transport path or the go-around transport path since processing by the rinsing unit 14 is necessary after development.

(Developing Portion)

Insofar as the unexposed portion (not shown) of the flexographic printing plate precursor 70 can be removed and developed, the configuration of the developing portion 12 is not particularly limited, and is not limited to development using the brush 41 to be described later. The configuration of the brush is also not particularly limited, and a rotary brush and a brush having a rotation axis parallel to the nip roller 36 can also be used in addition to the configuration of the brush 41 to be described later. In this case, a roller-shaped brush in which bristles are bundled radially with respect to a rotation axis can be used. In the developing portion 12, the configuration of the brush, the number of brushes, and the like are not particularly limited.

For example, the developing portion 12 has a developing unit 40 that performs development with respect to the flexographic printing plate precursor 70 which is in a state of being immersed in the washing solution Q in the developing tank 13 and is transported.

In the developing portion 12, a fatiqued developer Qw is generated in the developing tank 13 due to development by the developing unit 40. The fatiqued developer Qw is the washing solution Q containing a solid substance generated by removing the unexposed portion (not shown) of the flexographic printing plate precursor 70 due to development using the washing solution Q.

Figure 7:
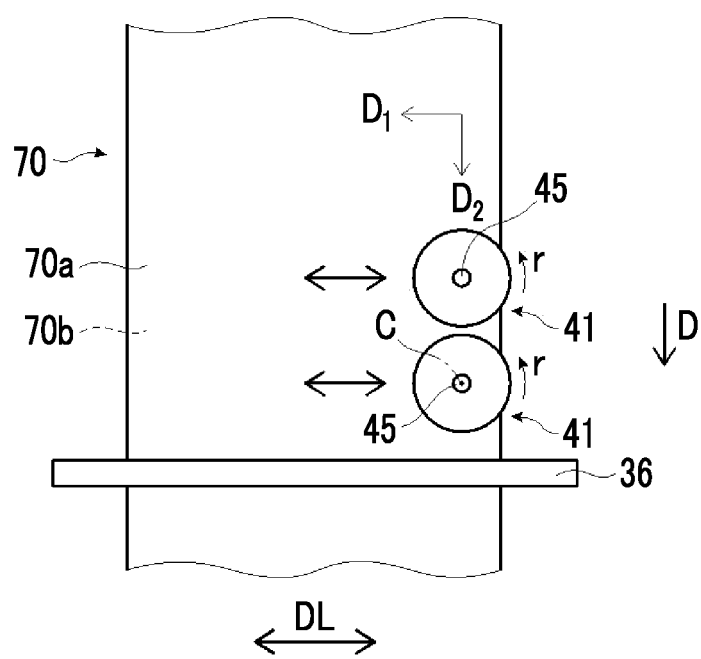
FIG. 7 is a schematic plan view showing an example of a developing portion of the washing device of the embodiment of the present invention.
Figure 8:
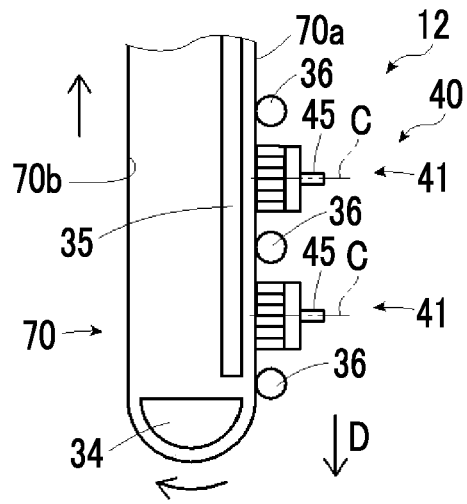
FIG. 8 is a schematic side view showing the example of the developing portion of the washing device of the embodiment of the present invention.
Figure 9:
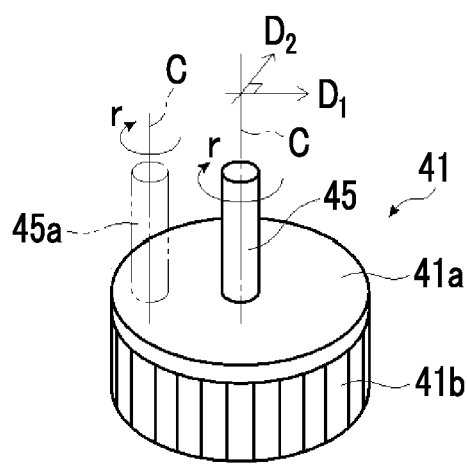
FIG. 9 is a schematic perspective view showing a configuration of a brush of the washing device of the embodiment of the present invention.
Figure 10:
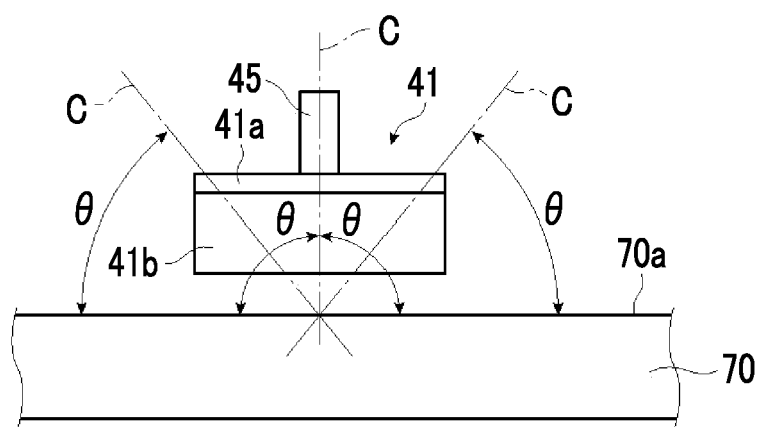
FIG. 10 is a schematic view showing the configuration of the brush of the washing device of the embodiment of the present invention.

Herein, FIG. 7 is a schematic plan view showing an example of the developing portion of the washing device of the embodiment of the present invention, and FIG. 8 is a schematic side view showing the example of the developing portion of the washing device of the embodiment of the present invention. In addition, FIG. 9 is a schematic perspective view showing a configuration of the brush of the washing device of the embodiment of the present invention, and FIG. 10 is a schematic view showing the configuration of the brush of the washing device of the embodiment of the present invention. A part of the nip roller 36 is not shown in FIG. 7.

The developing unit 40 of the developing portion 12 has the brush 41 used in development and a driving unit 26 that controls rotation about a rotation axis C (see FIG. 9) of the brush 41 and movement of the brush 41. In the configuration of the developing unit 40 shown in FIG. 7, there are two brushes 41.

In the developing unit 40, development can be simultaneously performed by the two brushes 41. Accordingly, an area rubbed by the brushes 41 can be increased, a development speed can be increased in a state where the adhesion of development residues is prevented and development uniformity is maintained. In this case, the rotation speeds of a plurality of brushes 41 may be the same, or the rotation speed may be changed for each of the plurality of brushes 41. In addition, the sizes of the two brushes 41 may be the same or may be different from each other.

In a case where a plurality of brushes are provided, for example, at least two brushes may be simultaneously driven by one motor instead of rotating each brush. In a case of the two brushes 41, at least the two brushes 41 may be simultaneously driven by one motor instead of rotating each brush 41. Accordingly, the number of motors can be reduced, and thus the device can be miniaturized. In addition, in a case where the plurality of brushes are rotated by one motor, the number of rotations can be changed for each brush 41 by providing a transmission. Accordingly, the number of motors can be reduced, and thus the device can be miniaturized. In addition, in a case where the plurality of brushes are rotated by one motor, the number of rotations can be changed for each brush 41 by providing a transmission.

The rotation about the rotation axis C of the brush 41 described above is rotation of the brush 41 with the rotation axis C as a rotation center, and the brush 41 spins. The rotation axis C is a fixed axis passing through one point in the brush 41. A rotation shaft portion 45 is provided at the brush 41, and a central axis of the rotation shaft portion 45 is the rotation axis C. The rotation shaft portion 45 functions as a rotation drive shaft that is rotated as power is transmitted from the driving unit 26, and the brush 41 spins, for example, in a rotation direction r as the rotation shaft portion 45 is rotated.

The driving unit 26 rotates the brush 41 in a state where the rotation axis C of the brush 41 passes through the front surface 70a of the flexographic printing plate precursor 70 (see FIG. 10). The driving unit 26 moves the rotation axis C of the brush 41 in at least one direction intersecting the rotation axis C. The rotation of the brush 41 and the movement of the brush 41 are controlled by the driving unit 26 unless stated otherwise.

As shown in FIG. 7, the brush 41 is disposed on a front surface 70a side of the flexographic printing plate precursor 70, and for example, a direction DL orthogonal to the transport direction D is set as a first moving direction $D_1$ of the brush 41, which intersects the rotation axis C. The brush 41 is configured to move in the direction DL. In addition, the brush 41 may be configured to be moved in two directions with respect to the rotation axis C. In a case of being moved in two directions, the two directions are not particularly limited insofar as the brush are moved in two directions, may be two directions intersecting the rotation axis C, or may be two directions orthogonal to the rotation axis C. Specifically, for example, the first moving direction $D_1$ is the direction DL, and a second moving direction $D_2$ is the transport direction D. Insofar as the brush 41 can uniformly rub the entire front surface 70a of the flexographic printing plate precursor 70, the moving directions of the brush 41 are not particularly limited. Insofar as the brush 41 is configured to be moved in the two directions orthogonal to each other, the entire front surface 70a of the flexographic printing plate precursor 70 can be uniformly rubbed by the brush 41, and development uniformity improves. Further, the development speed also improves by moving the brush 41 in the two directions orthogonal to each other.

<Brush>

The brush 41 performs development by removing the unexposed portion (not shown) of the flexographic printing plate precursor 70. For example, the brush 41 is immersed in the washing solution Q and is disposed on the front surface 70a side of the flexographic printing plate precursor 70 in the transport direction D in the developing tank 13. In a state where the flexographic printing plate precursor 70 is transported, the front surface 70a of the flexographic printing plate precursor 70 is rubbed as the brush 41 is rotated in the rotation direction r (see FIG. 7) by the driving unit 26, and development is performed by removing the unexposed portion (not shown) of the flexographic printing plate precursor 70. During the development, the fatiqued developer Qw described above is generated.

Since the brush 41 is disposed by being immersed in the washing solution Q, the washing solution Q adhered to the brush 41 is not dried, and the unexposed portion or the like removed by the brush 41 is prevented from being fixed to the brush 41 as development residues.

The area of the brush 41, which is obtained by projecting the brush 41 onto the front surface 70a of the flexographic printing plate precursor 70, is smaller than the area of the front surface 70a of the flexographic printing plate precursor 70. For this reason, the brush 41 is partially applied with respect to the entire width of the flexographic printing plate precursor 70 and performs development. During development, the brush 41 moves, for example, in the transport direction D and the direction DL as described above in order for the brush 41 to uniformly rub the entire front surface 70a of the flexographic printing plate precursor 70 since the brush 41 is small, but may be configured to move only in the direction DL.

A moving path of the brush 41 is determined in advance according to the size of the brush 41, the size and the transportation speed of the flexographic printing plate precursor 70, or the like. Accordingly, the moving path of the brush 41 is programmed in the driving unit 26, and the driving unit 26 can move the brush 41 along the moving path to perform development based on the program.

As shown in FIG. 9, the brush 41 is obtained, for example, by bundling bristles 41b perpendicular to a substrate 41a. The shape of the substrate 41a is the shape of the brush 41. For example, the substrate 41a is circular, but is not particularly limited thereto.

The rotation shaft portion 45 is provided on the substrate 41a. Accordingly, the rotation axis C is provided in the brush 41. In addition, by adjusting a position where the rotation shaft portion 45 is provided, the position of the rotation axis C can be adjusted in the brush 41. As shown in FIG. 9, the rotation shaft portion 45a can also be provided at a place other than the center of the substrate 41a.

Herein, the center of the brush 41 is the center of the substrate 41a of the brush 41, that is, the geometric center of a shape obtained by projecting the substrate 41a onto a plane. In a case where the substrate 41a is circular, the center of the circle is the center of the brush 41. In a case where the substrate 41a is rectangular, a point where diagonals of the rectangle intersect each other is the center of the brush 41.

The expression that the rotation axis C of the brush 41 passes through the center of the brush 41 means that the rotation shaft portion 45 is disposed such that the rotation axis C passes through the center of the substrate 41a in a case where the substrate 41a is circular. As the rotation axis C is disposed to pass through the center of the brush 41, the brush 41 can be uniformly brought into contact with the front surface 70a of the flexographic printing plate precursor 70. For this reason, development uniformity improves.

In addition, as the rotation axis C is disposed to pass through the center of the brush 41, the brush 41 rotates stably in a case where the brush 41 spins. For this reason, the brush can be stably rotated even in a case where the number of rotations is increased in order to increase the rotation speed of the brush 41. Accordingly, the development speed can be increased.

In addition, in a case where the plurality of brushes 41 are disposed in parallel, contact between the brushes 41 can be prevented even in a case where an interval between the brushes 41 is decreased. For this reason, the rotation axis C of the brush 41 preferably passes through the center of the brush 41.

For example, a brush called a cup brush is used as the brush 41. It is preferable that the bristles 41b of the brush 41 are used by being applied substantially perpendicular to the front surface 70a of the flexographic printing plate precursor 70.

The brush 41 is smaller than the flexographic printing plate precursor 70 as described above. As the brush 41 is small, the brush 41 is moved and performs development with respect to the flexographic printing plate precursor 70, the pressure of the brush 41 can be made uniform, and development uniformity can be improved.

Further, since a brush area necessary for development can be reduced as the brush 41 performs development by moving in a plane direction while the flexographic printing plate precursor 70 is transported, the washing device can be simplified.

The size of the brush 41 is not particularly limited insofar as the brush is smaller than the flexographic printing plate precursor 70. In a case where the outer shape of the substrate 41a of the brush 41 is circular, the diameter thereof is preferably 30 mm to 500 mm, the diameter is more preferably 100 to 400 mm, and the diameter is most preferably 200 to 400 mm.

In a case where the shape of the substrate 41a of the brush 41 is a brush shape other than a circle, a diameter equivalent to the circle, that is, a diameter corresponding to the brush area is the diameter in a case where the outer shape of the substrate 41a described above is circular.

In addition, the brush 41 rotates and performs development, but the number of rotations of the brush 41 is preferably 10 revolutions per minute (rpm) to 2,000 rpm, and more preferably 100 to 800 rpm.

By increasing the number of rotations of the brush 41 and increasing the rotation speed, the development speed can be increased as described above, and development uniformity also improves.

Herein, as for a mechanism of adhesion of development residues, it is estimated that development residues are deposited in the brush 41, are transferred and adhered to the flexographic printing plate precursor 70 at a certain timing during development. For this reason, it is necessary to efficiently discharge the development residues from the inside of the brush 41 to the outside of the brush 41. Thus, in a case where the number of rotations of the brush 41 is high, the washing solution in the brush 41 is likely to be discharged to the outside of the brush 41 due to rotation, and development residues in the brush 41 can be efficiently discharged to the outside of the brush 41.

In addition, the number of rotations of the brush 41 is not limited to being a fixed value, and may be variable. In a case where the number of rotations of the brush 41 is variable, for example, the number of rotations is determined in advance from the initial stage of development to the end of development, and development can be performed for the determined number of rotations.

The substrate 41a of the brush 41 holds the bristles 41b, and for example, the bristles are implanted in a bundle. Insofar as the substrate 41a can hold the bristles 41b and does not become deteriorated due to the washing solution Q, there is no particular limitation.

The material for the bristles of the brush 41 is not particularly limited. For example, natural fibers, such as coir, and any material that can be made into a fibrous form, such as a metal, polyamide, polyester, vinyl chloride, vinylidene chloride, polyimide, and polyacrylonitrile, are suitably used.

The fiber diameter of each bristle of the brush is preferably approximately 10μ to 1 mm, and may be implanted in a bundle or be independently implanted within several strands. The implanting interval is preferably approximately 1 to 20 mm, and in a case of being implanted in a bundle, the diameter of the bundle is preferably approximately 1 to 10 mm. In addition, the length of each bristle of the brush is preferably approximately 2 to 50 mm.

The length of the bristle may vary in one brush 41, and it is preferable bristles in a central portion is long. In addition, the thickness of each of the bristles in one brush 41 may vary, or the density of the bristles in one brush 41 may vary.

As described above, the driving unit 26 (see FIG. 1) rotates the brush 41 in a state where the rotation axis C of the brush 41 passes through the front surface 70a of the flexographic printing plate precursor 70 (see FIG. 10). In this case, as shown in FIG. 10, in a case where an angle formed by the rotation axis C with respect to the front surface 70a of the flexographic printing plate precursor 70 is set as θ, the angle θ is preferably $30° \leq \theta \leq 90°$, more preferably $45° \leq \theta \leq 90°$, and most preferably $60° \leq \theta \leq 90°$. By setting the angle θ to $60° \leq \theta \leq 90°$, the brush 41 can be uniformly brought into contact with the front surface 70a of the flexographic printing plate precursor 70, and development can be performed even in a case where the pressure of the brush 41 is increased. For this reason, both of development uniformity and the development speed can be increased. As described above, it is most preferable that the rotation axis C of the brush 41 is perpendicular to the front surface 70a of the flexographic printing plate precursor 70.

The angle θ can be obtained as follows. First, an image of a state where the brush 41 is disposed on the front surface 70a of the flexographic printing plate precursor 70 is acquired, a line corresponding to the rotation axis C of the brush 41 and a line corresponding to the front surface 70a of the flexographic printing plate precursor 70 are acquired from the image. Next, an angle formed by the two lines is acquired. Accordingly, the angle θ can be obtained.

A state where the rotation axis C of the brush 41 passes through the front surface 70a of the flexographic printing plate precursor 70 means passing through the front surface 70a of the flexographic printing plate precursor 70 or a surface obtained by expanding the front surface 70a of the flexographic printing plate precursor 70 in a case where the rotation axis C or the rotation axis C is extended, and shows a disposition relationship between the brush 41 and the flexographic printing plate precursor 70.

For this reason, the rotation axis C of the brush 41 does not pass through the actual front surface 70a of the flexographic printing plate precursor 70 in some cases depending on the inclination of the rotation axis C, but the rotation axis C of the brush 41 is not limited to actually passing through the front surface 70a of the flexographic printing plate precursor 70 as described above.

The position of the brush 41 may be fixed to the front surface 70a of the flexographic printing plate precursor 70. In addition, a configuration where the brush approaches or separates from the front surface 70a of the flexographic printing plate precursor 70 may be adopted. As the brush 41 can approach or separate from the front surface 70a of the flexographic printing plate precursor 70, the pressure of the brush 41 can be adjusted with respect to the front surface 70a of the flexographic printing plate precursor 70. Accordingly, the pressure of the brush 41 can be increased, and the development speed can be improved.

In a case where the pressure of the brush 41 is increased, it is preferable that the material for the bristles 41b of the brush 41, the length of each bristle, the thickness of each bristle, or the like corresponds to the pressure. The bristles of the central portion in one brush 41 may be made long, the thickness of each of bristles in one brush 41 may be changed, or the density of the bristles in one brush 41 may be changed.

In addition, as the brush 41 can be separated from the front surface 70a of the flexographic printing plate precursor 70, the brush 41 can be lifted from the front surface 70a of the flexographic printing plate precursor 70. Accordingly, in a case where the development residues of the brush 41 are adhered, the development residues can be removed from the brush 41.

As for the operation of the brush 41, the brush 41 may move constantly during development, or the brush 41 may rotate only when the flexographic printing plate precursor 70 is transported to the developing tank 13. In this case, for example, a sensor that detects the flexographic printing plate precursor 70 is provided above the developing tank 13, a time when the brush 41 is reached is identified using the transport timing and the transportation speed of the flexographic printing plate precursor 70, and development can be performed by rotating the brush 41.

In addition, for example, the outside of the flexographic printing plate precursor 70 and the upper side of the front surface 70a of the flexographic printing plate precursor 70 can be used as a retracting place for the brush 41. The driving unit 26 moves the brush 41 to the retracting place, and the driving unit 26 causes the brush 41 to retract from the flexographic printing plate precursor 70. By retracting the brush 41 from the flexographic printing plate precursor 70, development residues are prevented from adhering, which is preferable.

In a case where the retracting place is outside the flexographic printing plate precursor 70, development residues are unlikely to adhere to the front surface 70a of the flexographic printing plate precursor 70 again, and the development residues can be further prevented from adhering compared to a case where the brush 41 is retracted by being simply lifted from the front surface 70a of the flexographic printing plate precursor 70.

In a case of removing the development residues, in addition to moving the brush 41 to the retracting place, retracting conditions such as development time and a development treatment area are set, and in a case where the retracting conditions are satisfied, the brush 41 may be configured to be moved to the retracting place. In this case, for example, the sensor that detects the flexographic printing plate precursor 70 is provided above the developing tank 13, the retracting conditions are set in the driving unit 26, the input amount of the flexographic printing plate precursor 70 is identified using the transport timing and the transportation speed of the flexographic printing plate precursor 70, and the retraction of the brush 41 can be controlled.

In addition, in order to efficiently discharge the development residues in the brush 41 to the outside of the brush 41, the washing solution may be supplied to the brush 41 at the retracting place for the brush 41, and the development residues may be discharged to the outside of the brush 41.

(Rinsing Unit)

The rinsing unit 14 removes residues, such as latex components and rubber components remaining on the front surface 70*a* of the developed flexographic printing plate precursor 70, using the washing solution or the like. Removing residues, such as latex components and rubber components remaining on the front surface 70*a* of the flexographic printing plate precursor 70, using the washing solution or the like by the rinsing unit 14 is called a rinsing step.

The developed flexographic printing plate precursor 70 is transported from the developing portion 12, is transported to the outside of the developing tank 13, and is processed by the rinsing unit 14.

The rinsing unit 14 has, for example, a supply unit 22 that supplies the fatiqued developer Qw processed by the processing unit 18 to the front surface 70*a* of the flexographic printing plate precursor 70. The fatiqued developer Qw processed by the processing unit 18 is supplied to the supply unit 22 via a pipe 20. The supply unit 22 is a nozzle that is for supplying at least the washing solution Q to the front surface 70*a* of the flexographic printing plate precursor 70, from which the unexposed portion of the flexographic printing plate precursor 70 is removed.

The rinsing unit 14 applies, as the washing solution Q from the supply unit 22, the fatiqued developer Qw processed by the processing unit 18, for example, to the front surface 70*a* of the developed flexographic printing plate precursor 70, for example, in a spray-like manner, washing away the residues described above. The fatiqued developer Qw from the supply unit 22 and the residues, which are washed away and are described above, accumulate in the developing tank 13.

The washing solution Q to be supplied may be the washing solution Q newly prepared in another tank (not shown). In this case, as shown in FIG. 1, a supply pipe 21*a* is connected to the pipe 20, and a valve 21*b* is provided at the supply pipe 21*a* and is connected to a rinsing liquid supply unit 21. The rinsing liquid supply unit 21 stores the washing solution Q, and supplies the washing solution Q to the supply unit 22 at a specific flow rate. The rinsing liquid is the washing solution Q.

During the rinsing step, the washing solution Q is supplied from the rinsing liquid supply unit 21 to the supply unit 22 via the valve 21*b* and the supply pipe 21*a*.

(Processing Unit)

The processing unit 18 removes solid substances 23 in the fatiqued developer Qw containing the solid substances 23 generated by removing the unexposed portion due to development using the washing solution Q. The fact that the fatiqued developer Qw contains the solid substances 23 means a state where the solid substances 23 are dissolved or dispersed.

In addition, the processed fatiqued developer Qw is the fatiqued developer Qw from which the solid substances 23 contained in the fatiqued developer Qw are removed.

The solid substances 23 removed by the processing unit 18 from the fatiqued developer Qw are collected by a saucer 19 provided below the processing unit 18.

On the other hand, the fatiqued developer Qw from which the solid substances 23 are removed, that is, the processed fatiqued developer Qw described above is supplied to the supply unit 22 through the pipe 20, and is used in the rinsing unit 14. For example, a pump (not shown) is used to supply the processed fatiqued developer Qw from the processing unit 18 to the supply unit 22.

Since the fatiqued developer Qw can be reused by providing the processing unit 18, the washing solution Q can be effectively used, and the using efficiency of the washing solution Q can be increased.

The configuration of the processing unit 18 is not particularly limited insofar as the solid substances 23 can be removed from the fatiqued developer Qw as described above, and the processing unit is composed of, for example, a centrifuge.

In addition, a separation membrane 24 that removes the solid substances 23 in the fatiqued developer Qw may be provided in the pipe 20. The separation membrane 24 is not particularly limited insofar as the solid substances contained in the fatiqued developer Qw can be separated out, and is determined as appropriate according to the size of a solid substance to be separated out. For example, a ceramic filter is used. It is preferable that the separation membrane 24 can separate out, for example, a solid substance having a particle diameter of 1 μm or less.

The separation membrane 24 is not necessarily required, and a configuration where the separation membrane is not provided may be adopted. However, causing the fatiqued developer Qw to pass through the separation membrane 24 can further decrease the concentration of solid substances of the fatiqued developer Qw supplied to the rinsing unit 14, and is preferable since the rinsing unit 14 can use the fatiqued developer Qw having a low concentration of solid substances.

In addition, the separation membrane 24 may be configured to be used as the processing unit 18. In this case, for example, only the separation membrane 24 is provided without providing the centrifuge described above.

The processing unit 18 is not necessarily required, and a configuration where there is no processing unit 18 may be adopted. In this case, for example, the rinsing unit 14 uses the washing solution Q.

Herein, the higher the concentration of solid substances contained in the fatiqued developer Qw, the more development residues are fixed, which is more likely to contaminate the device. Therefore, the lower the concentration of solid substances in the fatiqued developer Qw, the better maintainability, since the contamination of the device can be prevented. For this reason, it is preferable to provide the processing unit 18 that removes solid substances.

(Washing Method)

Next, the washing method for the flexographic printing plate precursor 70, in which the washing device 10 is used, will be described.

First, the front surface 70*a* of the flexographic printing plate precursor 70 is imagewise exposed, that is, exposed in a specific pattern by the exposure device (not shown).

Next, the front end of the flexographic printing plate precursor 70 is fixed to the front end leader 37, and the rear end is fixed to the rear end leader 38. Next, for example, the front end leader 37 is fixed by being hooked or the like to the fixing units 31*b* of the pair of transport chains 31 respectively. For example, the rear end leader 38 is fixed to the fixing units 31*b* of the transport chains 31 using a magnet. The flexographic printing plate precursor 70 is transported along the transport path Dp by the transporting unit 11. In a state where the flexographic printing plate precursor 70 is immersed in the washing solution Q and is transported, the brush 41 of the developing unit 40 performs development by removing the unexposed portion of the flexographic printing plate precursor 70. In the developing step of performing the development, while transporting the flexographic printing plate precursor 70, for example, the brush 41 is rotated in a state where the rotation axes C of the two brushes 41 pass through the front surface 70a of the flexographic printing plate precursor 70 and the rotation axes C of the brushes 41 are moved in at least one direction intersecting the rotation axes C as described above. Since the operations of the brushes 41 are as described above, detailed description thereof will be omitted. In the developing step, the fatiqued developer Qw is generated.

Then, the flexographic printing plate precursor 70 comes out of the developing tank 13. In a state where the flexographic printing plate precursor 70 is transported, the supply unit 22 applies, for example, the fatiqued developer Qw processed by the processing unit 18 to the front surface 70a of the flexographic printing plate precursor 70, and the residues on the front surface 70a is removed. Then, the flexographic printing plate precursor 70 is transported until the flexographic printing plate precursor passes through the rinsing unit 14. In a case where development is performed once, at this time point, the fixing of the front end leader 37 and the rear end leader 38 is released, and the flexographic printing plate precursor 70 is removed from the washing device 10. In a case where development is performed a plurality of times, the flexographic printing plate precursor 70 is transported by going around, and is transported to the developing portion 12 again to perform development. Until a predetermined number of times is reached, the developing step and the rinsing step are performed repeatedly.

By setting the transport path Dp that goes around the vicinity of the frame 15 as in the washing device 10, a provision area can be decreased compared to a transport path through which the flexographic printing plate precursor 70 is transported in one direction.

By changing the sizes of the member 15a and the beam member 15b of the frame 15, it is possible to correspond to the size of the flexographic printing plate precursor 70. Even in a case where the flexographic printing plate precursor 70 is large, the configuration of the washing device 10 does not become complicated.

Further, by making the frame 15 in an upright state as shown in FIG. 1 and configuring the flexographic printing plate precursor 70 to be transported perpendicularly to a liquid level of the washing solution Q in the developing tank 13, a ground contact area can be decreased compared to a state where the frame 15 is rotated 90° from the state shown in FIG. 1, and the space can be saved. In addition, even in a case where the transport path Dp is long, without increasing the washing device 10 in size, the ground contact area can be decreased and the space can be saved. In a state where the frame 15 is rotated 90° from the state shown in FIG. 1, in a case of development, it is necessary to increase a region immersed in the washing solution Q and it is necessary to increase the developing tank 13 as well.

In the washing device 10, the flexographic printing plate precursor 70 is transported using the transport chain 31, and maintainability is excellent without having a complicated device configuration.

In addition, by performing the developing step in a state where the flexographic printing plate precursor 70 is being transported, a development treatment amount per unit time can be made large compared to batch processing, so that the washing device 10 has a high productivity.

Further, by developing the flexographic printing plate precursor 70 in the linear transport passage Dps, the entire brush comes into contact therewith, so that the efficiency of development can be improved, and the productivity of the washing device 10 is high.

In addition, by developing the flexographic printing plate precursor 70 in the washing solution Q, development residues are prevented from being fixed to the brush 41, and the frequency of maintenance can be decreased. Accordingly, a maintenance load can be decreased, and the washing device 10 is excellent in maintainability.

Since the frequency of maintenance can be decreased, for example, monthly average or annual average development treatment can be increased, and the washing device 10 has a high productivity from this point as well.

(Other Configurations of Transporting Unit and Developing Unit)

Configurations of the transporting unit 11 and the developing unit 40 are not limited to the configurations described above, and may be other configurations.

Figure 11:
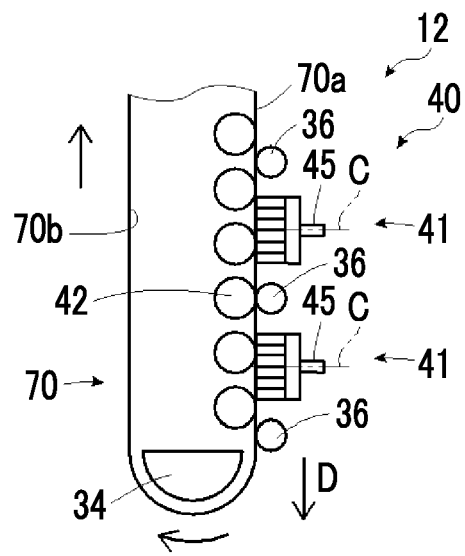
FIG. 11 is a schematic view showing another example of the developing portion of the washing device of the embodiment of the present invention.
Figure 12:
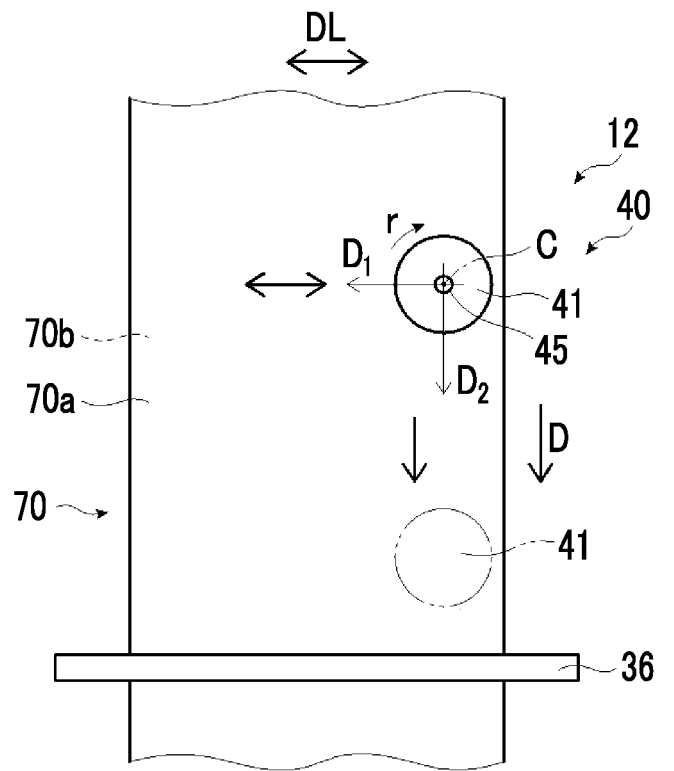
FIG. 12 is a schematic plan view showing still another example of the developing portion of the washing device of the embodiment of the present invention.

Herein, FIG. 11 is a schematic view showing another example of the developing portion of the washing device of the embodiment of the present invention, and FIG. 12 is a schematic plan view showing still another example of the developing portion of the washing device of the embodiment of the present invention.

In FIGS. 11 and 12, the same components as the developing portion 12 shown in FIG. 7 will be assigned with the same reference numerals, and detailed description thereof will be omitted.

For example, as in the developing unit 40 of the developing portion 12 shown in FIG. 11, instead of the back plate portion 35 (see FIG. 1), a plurality of guide rollers 42 may be disposed at positions facing the brush 41 with the flexographic printing plate precursor 70 sandwiched therebetween. Each of the guide rollers 42 can rotate. Like the back plate portion 35 (see FIG. 1), by disposing the guide rollers 42, the back surface 70b of the flexographic printing plate precursor 70 is supported by the guide rollers 42 in a case of removing the unexposed portion by the brush 41, so that the unexposed portion can be efficiently removed. In addition, the guide rollers 42 function as transport guides for the flexographic printing plate precursor 70, and the flexographic printing plate precursor 70 can be more stably transported.

In addition, like the back plate portion 35 described above, each of the guide rollers 42 can be formed of a metal such as stainless steel and titanium. Like the back plate portion 35, hard chrome plating and diamond-like carbon (DLC) or titanium nitride (TiN) surface treatment may be performed on the surfaces of the guide rollers 42.

In addition, although a configuration where two brushes 41 are provided is adopted, without being limited thereto, there may be one brush 41 as shown in FIG. 12. In this case, for example, with the first moving direction $D_1$ set as the direction DL and the second moving direction $D_2$ set as the transport direction D, the brush 41 is configured to be moved in two directions orthogonal to the rotation axis C. However, the brush may be configured to be moved only in the first moving direction $D_1$, that is, the direction DL.

As described above, since the brush 41 is smaller than the front surface 70a of the flexographic printing plate precursor 70, the brush 41 is partially applied with respect to the entire width of the flexographic printing plate precursor 70 to perform development. As described above, since the brush 41 is small, the brush is moved, for example, in two directions orthogonal to each other during development. In addition to moving the brush 41 in the two directions orthogonal to each other, the brush may be configured to be moved in at least one direction intersecting the rotation axis, for example, the direction DL. By moving the brush 41 in this manner, development can be efficiently performed with the small brush 41.

Insofar as the brush 41 can uniformly rub the entire front surface 70a of the flexographic printing plate precursor 70 during development, the moving direction of the brush 41 is not particularly limited.

In addition, the moving path of the brush 41 is determined in advance according to the size of the brush 41, the size and the transportation speed of the flexographic printing plate precursor 70, or the like. Accordingly, by programming the moving path of the brush 41, development can be performed based on the program.

The configuration of the developing unit 40 of the developing portion 12 is not limited to the configuration described above, and may be a configuration to be described below.

Figure 13:
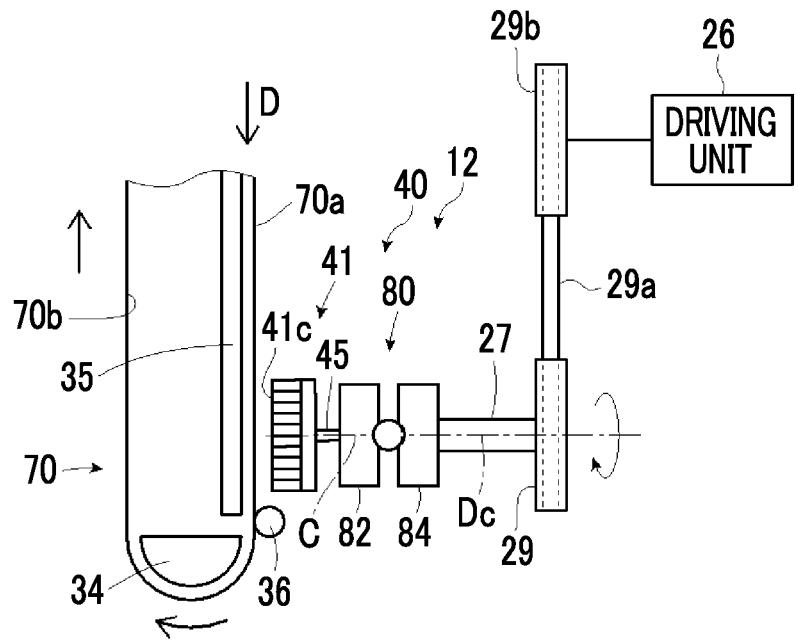
FIG. 13 is a schematic view showing still another example of the developing portion of the washing device of the embodiment of the present invention.
Figure 14:
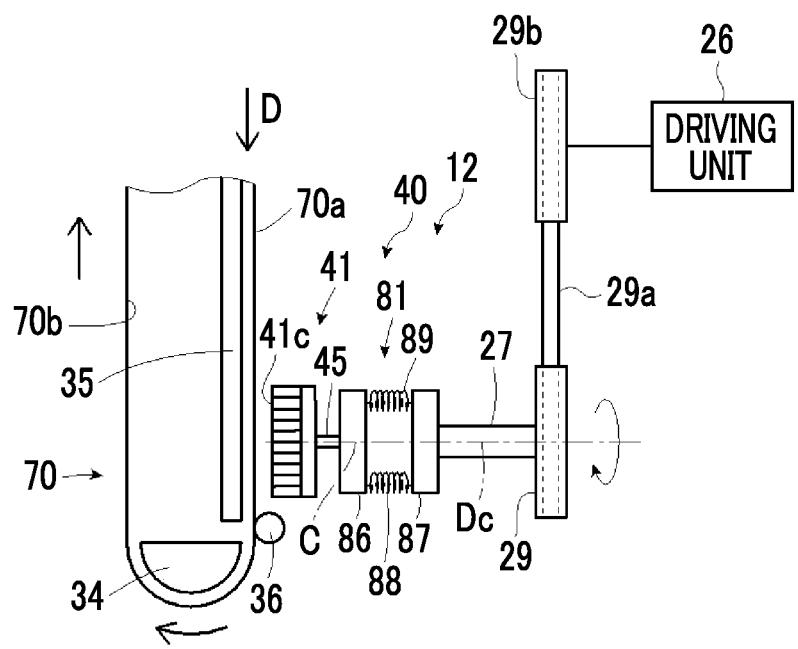
FIG. 14 is a schematic view showing still another example of the developing portion of the washing device of the embodiment of the present invention.
Figure 15:
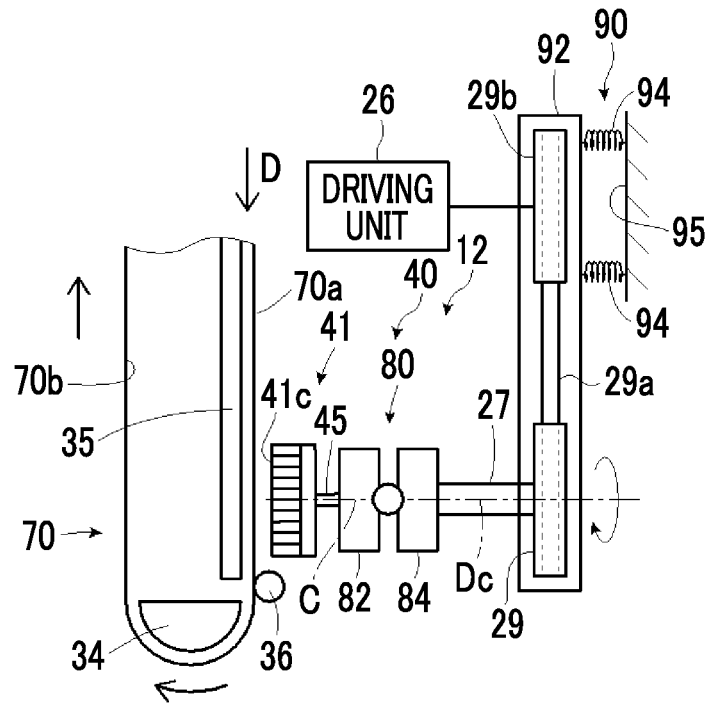
FIG. 15 is a schematic view showing still another example of the developing portion of the washing device of the embodiment of the present invention.

Herein, FIGS. 13 to 15 are schematic views showing another example of the developing portion of the washing device of the embodiment of the present invention. In FIGS. 1.3 to 15, the same components as the developing portion 12 shown in FIG. 7 will be assigned with the same reference numerals, and detailed description thereof will be omitted. Although a configuration where there is one brush 41 is shown in FIGS. 13 to 15, the developing unit 40 shown in FIGS. 13 to 15 can also be applied to a configuration where there are two brushes 41 described above, and can also be applied to a configuration where there are three brushes 41.

The driving unit 26 (see FIG. 1) is connected to a rotating driving shaft portion 27 to be described later. The driving shaft portion 27 of the driving unit 26 and the rotation shaft portion 45 of the brush 41 are connected to each other such that the rotational force of the driving shaft portion 27 of the driving unit 26 can be transmitted to the rotation axis C of the brush 41, and a shaft joint portion 80 that adjusts the rotation axis C of the brush 41 with respect to the front surface 70a of the flexographic printing plate precursor 70 is provided. The inclination of the rotation axis C of the brush 41 is adjusted by the shaft joint portion 80, a front end surface 41c of the brush 41 is disposed parallel to the front surface 70a of the flexographic printing plate precursor 70.

The shaft joint portion 80 shown in FIG. 13 is called a ball joint. A first member 82 and a second member 84 of the shaft joint portion 80 are connected to each other via a ball 85. The ball 85 allows the first member 82 and the second member 84 to move relatively to each other.

The first member 82 is connected to the rotation shaft portion 45 of the brush 41. The second member 84 is connected to the driving shaft portion 27. At an end of the driving shaft portion 27, which is on an opposite side to the second member 84, for example, a pulley 29 is provided. A pulley 29b is disposed to face the pulley 29, and a transmission belt 29a is wound around the pulley 29 and the pulley 29b. The driving unit 26 is connected to the pulley 29b. In a case where the pulley 29b is rotated by the driving unit 26, the pulley 29 rotates and the driving shaft portion 27 rotates. The rotational force of the driving shaft portion 27 is transmitted to the rotation shaft portion 45 via the shaft joint portion 80, and the brush 41 rotates.

As described above, since the ball 85 allows the first member 82 and the second member 84 to move relatively to each other, the inclination of the rotation axis C of the rotation shaft portion 45 of the brush 41 with respect to the front surface 70a of the flexographic printing plate precursor 70 can be changed. Accordingly, the direction of the front end surface 41c of the brush 41 can be changed, and the front end surface 41c of the brush 41 can be disposed parallel to the front surface 70a of the flexographic printing plate precursor 70. Accordingly, development can be performed in a state where the front end surface 41c of the brush 41 is uniformly in contact with the front surface 70a of the flexographic printing plate precursor 70, and by preventing one-sided contact or the like, development can be performed efficiently and even better.

In addition, due to the device configuration, also in a case where the rotation axis C of the brush 41 is inclined, a drive shaft Dc can be made horizontal by the shaft joint portion 80.

The shaft joint portion 80 is not limited to the configuration shown in FIG. 13, a universal joint, flexible coupling, a floating joint, and the like are used. In addition, for example, a shaft joint portion 81 shown in FIG. 14 may be used. In FIG. 14, the same components as the components shown in FIG. 13 will be assigned with the same reference numerals, and detailed description thereof will be omitted. Except that the configuration is different, the shaft joint portion 81 shown in FIG. 14 has the same function as the shaft joint portion 80 shown in FIG. 13.

The shaft joint portion 81 shown in FIG. 14 has, for example, a first flange 86, a second flange 87, and two elastic members 88 and 89. The first flange 86 and the second flange 87 are disposed to face each other, and the two elastic members 88 and 89 are provided between the first flange 86 and the second flange 87. The two elastic members 88 and 89 are, for example, springs.

The first flange 86 and the second flange 87 can move relatively to each other as the two elastic members 88 and 89 are displaced.

The first flange 86 is connected to the rotation shaft portion 45 of the brush 41. The second flange 87 is connected to the driving shaft portion 27.

As described above, since the two elastic members 88 and 89 allow the first flange 86 and the second flange 87 to move relatively to each other, the inclination of the rotation axis C of the rotation shaft portion 45 of the brush 41 with respect to the front surface 70a of the flexographic printing plate precursor 70 can be changed. Accordingly, the direction of the front end surface 41c of the brush 41 can be changed, and the front end surface 41c of the brush 41 can be disposed parallel to the front surface 70a of the flexographic printing plate precursor 70. Development can be performed in a state where the front end surface 41c of the brush 41 is uniformly in contact with the front surface 70a of the flexographic printing plate precursor 70, and by preventing one-sided contact or the like, development can be performed efficiently and even better.

In addition, due to the device configuration, also in a case where the rotation axis C of the brush 41 is inclined, the drive shaft Dc can be made horizontal by the shaft joint portion 81.

In addition, by providing the two elastic members 88 and 89, for example, in a contracted state compared to a state where a force does not act, the first flange 86 and the second flange 87 receive a force relatively separating away from each other. Accordingly, the first flange 86 is displaced to the front surface 70a side of the flexographic printing plate precursor 70, and the front end surface 41c of the brush 41 can be pressed against the front surface 70a of the flexographic printing plate precursor 70. The two elastic members 88 and 89 are not limited to springs, and may be rubber, elastomer, or the like. The number of elastic members is also not limited to two, may be one, or may be three or more, and the number of elastic members is determined as appropriate according to a force acting on the brush 41 or the like.

In addition, as shown in FIG. 15, a configuration where there is a pressing unit 90 that presses the front end surface 41*c* of the brush 41 against the front surface 70*a* of the flexographic printing plate precursor 70 may be adopted. In FIG. 15, the same components as the components shown in FIG. 13 will be assigned with the same reference numerals, and detailed description thereof will be omitted.

For example, the pressing unit 90 presses the driving shaft portion 27 to the front surface 70*a* side of the flexographic printing plate precursor 70 and presses the front end surface 41*c* of the brush 41 against the front surface 70*a* of the flexographic printing plate precursor 70.

The transmission belt 29*a* is wound around the pulley 29 provided at the driving shaft portion 27 and the pulley 29*b* disposed to face the pulley 29. The driving unit 26 is connected to the pulley 29*b*, and the pulley 29*b* is rotated by the driving unit 26. The pulley 29, the transmission belt 29*a*, and the pulley 29*b* are accommodated in a case 92. In the case 92, an elastic member 94 is provided on a pulley 29*b* side, for example, in a contracted state compared to a state where a force does not act. A fixing wall 95 is fixed to an end part of the elastic member 94 on an opposite side to the case 92. The elastic member 94 allows the case 92 to be pressed to a flexographic printing plate precursor 70 side and the front end surface 41*c* of the brush 41 to be pressed against the front surface 70*a* of the flexographic printing plate precursor 70 via the driving shaft portion 27 and the shaft joint portion 80.

By providing the pressing unit 90 in addition to the shaft joint portion 80, the front end surface 41*c* of the brush 41 can be pressed against the front surface 70*a* of the flexographic printing plate precursor 70 in a state where the front end surface 41*c* of the brush 41 is disposed parallel to the front surface 70*a* of the flexographic printing plate precursor 70. Accordingly, development can be performed in a state where the front end surface 41*c* of the brush 41 is uniformly pressed against the front surface 70*a* of the flexographic printing plate precursor 70, and development can be performed more efficiently and even better.

Although the shaft joint portion 80 shown in FIG. 13 is used in FIG. 15, without being limited thereto, the shat joint portion 81 shown in FIG. 14 can also be used. In addition thereto, a universal joint, flexible coupling, a floating joint, and the like can be used as described above.

(Another Example of Washing Method)

Next, another example of the washing method for the flexographic printing plate precursor 70, in which the washing device 10 is used, will be described.

First, the front surface 70*a* of the flexographic printing plate precursor 70 is imagewise exposed, that is, exposed in a specific pattern by the exposure device (not shown).

Next, the front end of the flexographic printing plate precursor 70 is fixed to the front end leader 37, and the rear end is fixed to the rear end leader 38. Next, for example, the front end leader 37 is fixed by being hooked or the like to the fixing units 31*b* of the pair of transport chains 31 respectively. For example, the rear end leader 38 is fixed to the fixing units 31*b* of the transport chains 31 using a magnet. The flexographic printing plate precursor 70 is transported along the transport path Dp by the transporting unit 11. In a state where the flexographic printing plate precursor 70 is immersed in the washing solution Q and is transported, the brush 41 of the developing unit 40 performs development by removing the unexposed portion of the flexographic printing plate precursor 70. In the developing step of performing the development, while transporting the flexographic printing plate precursor 70, for example, the brush 41 is rotated in a state where the rotation axes C of the two brushes 41 pass through the front surface 70*a* of the flexographic printing plate precursor 70 and the rotation axes C of the brushes 41 are moved in at least one direction intersecting the rotation axes C as described above. Since the operations of the brushes 41 are as described above, detailed description thereof will be omitted. In the developing step, the fatiqued developer Qw is generated.

Further, by the shaft joint portion 80 shown in FIG. 13 and the shaft joint portion 81 shown in FIG. 14, which are described above, the inclination of the rotation axis C of the brush 41 with respect to the front surface 70*a* of the flexographic printing plate precursor 70 is adjusted, and the front end surface 41*c* of the brush 41 is disposed parallel to the front surface 70*a* of the flexographic printing plate precursor 70, in the developing step. Accordingly, development can be performed in a state where the front end surface 41*c* of the brush 41 is disposed parallel to the front surface 70*a* of the flexographic printing plate precursor 70.

In addition to the shaft joint portion 80 shown in FIG. 13 and the shaft joint portion 81 shown in FIG. 14, which are described above, further, the pressing unit 90, which is described above and is shown in FIG. 15, presses the front end surface 41*c* of the brush 41 against the front surface 70*a* of the flexographic printing plate precursor 70 in the developing step. Accordingly, development can be performed in a state where the front end surface 41*c* of the brush 41 is disposed parallel to the front surface 70*a* of the flexographic printing plate precursor 70 and a state where the front end surface 41*c* of the brush 41 is pressed against the front surface 70*a* of the flexographic printing plate precursor 70.

Then, the flexographic printing plate precursor 70 comes out of the developing tank 13. In a state where the flexographic printing plate precursor 70 is transported, the supply unit 22 applies, for example, the fatiqued developer Qw processed by the processing unit 18 to the front surface 70*a* of the flexographic printing plate precursor 70, and the residues on the front surface 70*a* is removed. Then, the flexographic printing plate precursor 70 is transported until the flexographic printing plate precursor passes through the rinsing unit 14. In a case where development is performed once, at this time point, the fixing of the front end leader 37 and the rear end leader 38 is released, and the flexographic printing plate precursor 70 is removed from the washing device 10. In a case where development is performed a plurality of times, the flexographic printing plate precursor 70 is transported by going around, and is transported to the developing portion 12 again to perform development. Until a predetermined number of times is reached, the developing step and the rinsing step are performed repeatedly.

Figure 16:
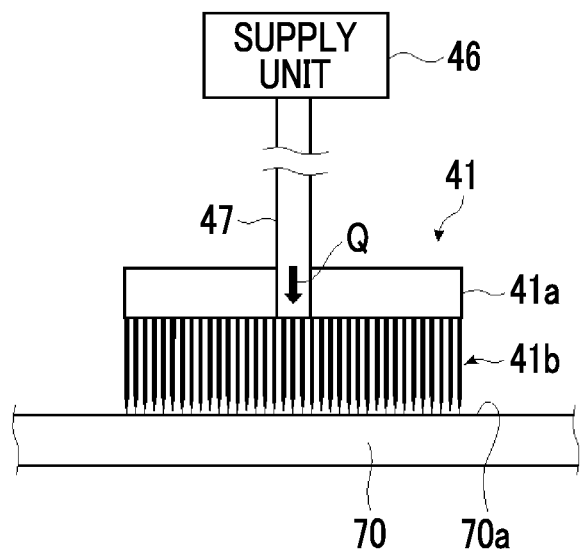
FIG. 16 is a schematic cross-sectional view showing the brush used in the developing portion of the washing device of the embodiment of the present invention.

Although development is performed in a state where the flexographic printing plate precursor 70 is immersed in the washing solution Q in the washing device 10, without being limited thereto, development can be performed while supplying the washing solution Q to the brush 41. In this case, as the configuration of the brush 41, for example, the brush 41 in which a supply pipe 47 is provided may be used as shown in FIG. 16. The supply pipe 47 is connected to a supply unit 46 that supplies the washing solution Q. The washing solution Q is supplied from the supply unit 46 to the brush 41 via the supply pipe 47, and the washing solution Q is supplied between the brush 41 and the front surface 70*a* of the flexographic printing plate precursor 70.

In addition, as shown in FIG. 17, the supply pipe 47 may be provided outside the brush 41, and the washing solution Q may be supplied between the brush 41 and the front surface 70a of the flexographic printing plate precursor 70. In this case, development can be performed while supplying the washing solution Q from the supply unit 46 to the brush 41 via the supply pipe 47.

Performing development while supplying the washing solution Q is preferable since the adhesion of development residues is prevented.

(Another Example of Rinsing Unit)

The configuration of the rinsing unit is not limited to the configuration shown in FIG. 1, and for example, the rinsing unit 14 having a configuration shown below can be used.

FIGS. 18 to 25 are schematic views showing a first example to an eighth example of the rinsing unit of the washing device of the embodiment of the present invention. In FIGS. 18 to 25, the same components as the washing device 10 shown in FIG. 1 will be assigned with the same reference numerals, and detailed description thereof will be omitted. In FIGS. 18 to 25, the showing of the processing unit 18, the pipe 20, the separation membrane 24, the rinsing liquid supply unit 21, the supply pipe 21a, and the valve 21b is partially omitted.

For example, as shown in FIG. 18, above a liquid level Qs of the washing solution Q, the rinsing unit 14 has the supply unit 22 disposed to face the front surface 70a of the flexographic printing plate precursor 70 and a liquid drain nozzle 50 provided on a downstream side from the supply unit 22 in the traveling direction of the flexographic printing plate precursor 70, that is, the downstream side in the transport direction D.

As described above, the supply unit 22 is a nozzle that is for supplying at least the washing solution Q to the front surface 70a of the flexographic printing plate precursor 70, from which the unexposed portion of the flexographic printing plate precursor 70 is removed.

The liquid drain nozzle 50 removes the washing solution Q supplied to the flexographic printing plate precursor 70 by the supply unit 22 by jetting a gas or removes the washing solution by sucking a gas. Insofar as the jetting of a gas or the sucking of a gas can be performed, the configuration of the liquid drain nozzle 50 is not particularly limited, and various pumps can be used.

As shown in FIG. 18, by providing the supply unit 22 and the liquid drain nozzle 50, the liquid drain nozzle 50 entrains the washing solution Q from the supply unit 22, and the supply amount of the washing solution Q from the supply unit 22 spreads to at least the front surface 70a of the flexographic printing plate precursor 70. Thus, the unexposed portion described above can be removed. Accordingly, the amount of the washing solution Q necessary for removing residues such as latex components and rubber components remaining on the front surface 70a of the developed flexographic printing plate precursor 70 can be decreased.

It is preferable to drive the supply unit 22 and the liquid drain nozzle 50 simultaneously. By driving the supply unit 22 and the liquid drain nozzle 50 simultaneously, the effect of entrainment of the washing solution Q described above is further obtained.

A nozzle angle γ of the liquid drain nozzle 50 is preferably 0° to 45°.

In a case where a ventilation port for a gas of the liquid drain nozzle 50 is on a line (hereinafter, referred to as a reference line) of 90° with respect to the front surface 70a of the flexographic printing plate precursor 70, the nozzle angle γ is set to 0°.

An angle formed by a line that is extended from the front surface 70a of the flexographic printing plate precursor 70 and passes through the ventilation port of the liquid drain nozzle 50 and the reference line is the nozzle angle γ.

Figure 19:
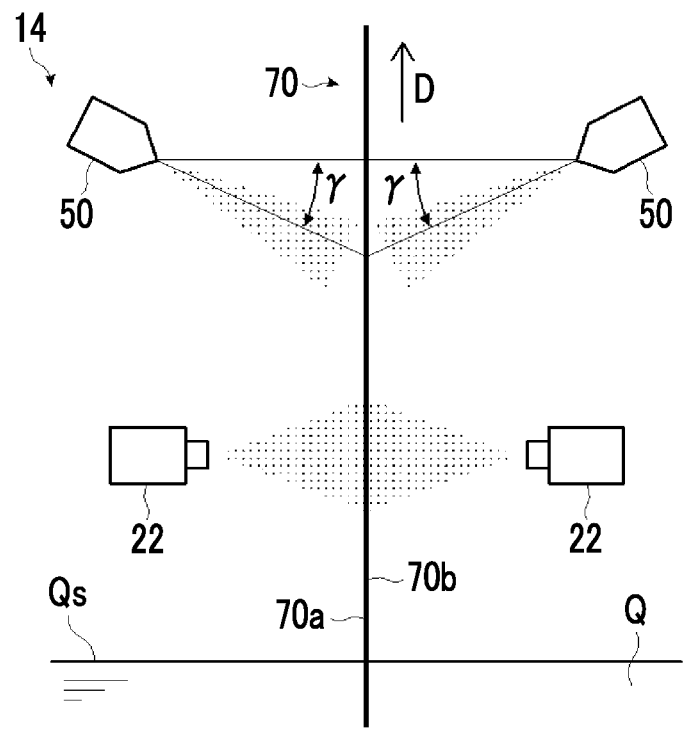
FIG. 19 is a schematic view showing a second example of the rinsing unit of the washing device of the embodiment of the present invention.

As shown in FIG. 19, the rinsing unit 14 may be configured such that the supply unit 22 and the liquid drain nozzle 50 are provided to face the back surface 70b at symmetrical positions with the flexographic printing plate precursor 70 interposed. Accordingly, residues such as latex components and rubber components that have remained during development can be removed from both surfaces of the flexographic printing plate precursor 70.

Figure 20:
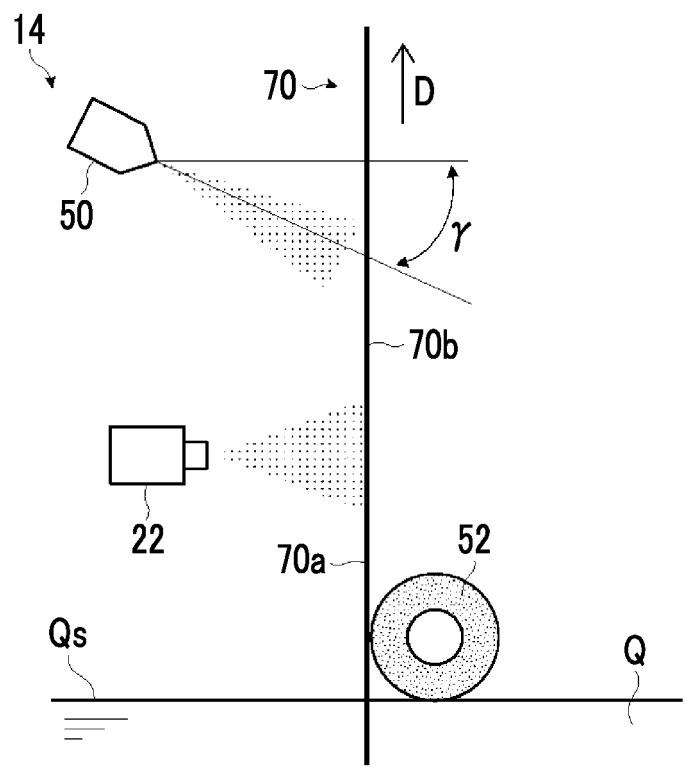
FIG. 20 is a schematic view showing a third example of the rinsing unit of the washing device of the embodiment of the present invention.

As shown in FIG. 20, the rinsing unit 14 may be configured to be provided with a brush 52 in contact with the back surface 70b of the flexographic printing plate precursor 70 in addition to the configuration shown in FIG. 18. For example, the brush 52 is a roller-shaped brush obtained by bundling bristles radially with respect to the shaft. Accordingly, in a case where the flexographic printing plate precursor 70 is transported, the brush 52 rotates in a state of being in contact with the back surface 70b, and residues such as latex components and rubber components remaining on the back surface 70b of the flexographic printing plate precursor 70 can be removed.

Figure 21:
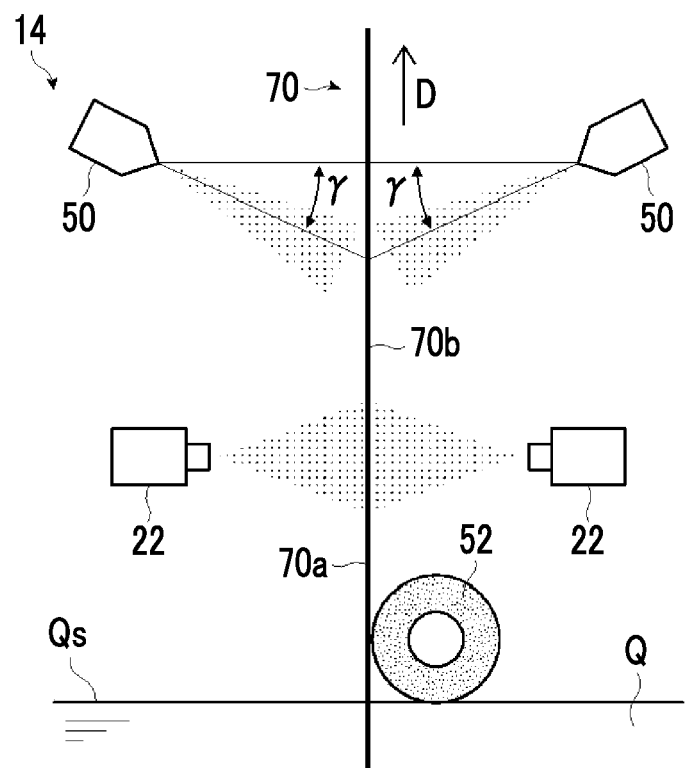
FIG. 21 is a schematic view showing a fourth example of the rinsing unit of the washing device of the embodiment of the present invention.

As shown in FIG. 21, the rinsing unit 14 may be configured to be provided with the brush 52 in contact with the back surface 70b of the flexographic printing plate precursor 70 in addition to the configuration shown in FIG. 19. Accordingly, in a case where the flexographic printing plate precursor 70 is transported, the brush 52 rotates in a state of being in contact with the back surface 70b, and residues such as latex components and rubber components remaining on the back surface 70b of the flexographic printing plate precursor 70 can be removed. Further, the residues that are not completely removed by the brush 52 can also be removed by the supply unit 22 and the liquid drain nozzle 50.

Although the brush 52 is disposed in contact with the liquid level Qs of the washing solution Q in FIGS. 20 and 21, without being limited thereto, the brush 52 may be disposed in state of being immersed in the washing solution Q.

Figure 22:
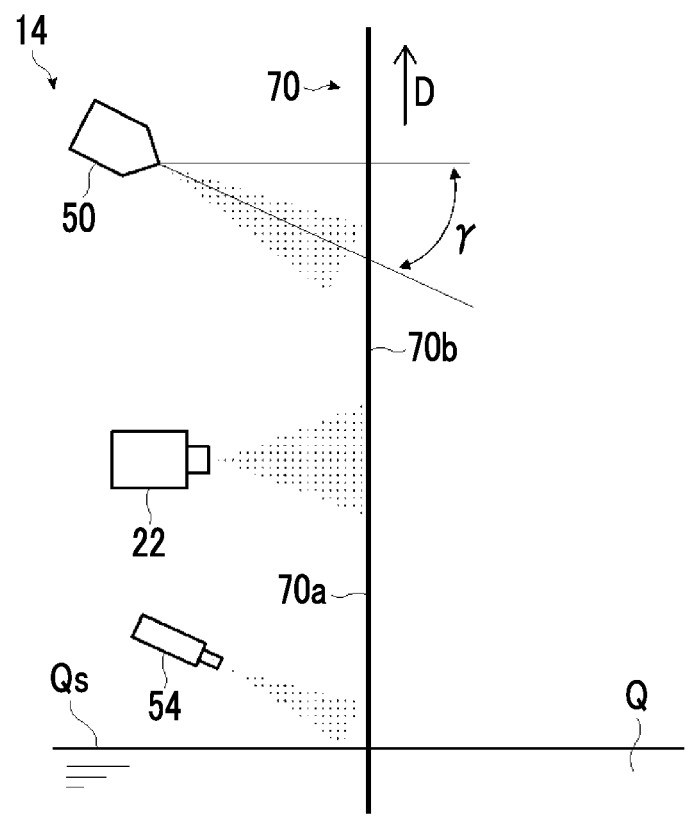
FIG. 22 is a schematic view showing a fifth example of the rinsing unit of the washing device of the embodiment of the present invention.

In addition, as shown in FIG. 22, a configuration where a prerinsing nozzle 54 is provided to face the front surface 70a of the flexographic printing plate precursor 70 may be adopted in addition to the configuration shown in FIG. 18.

The prerinsing nozzle 54 sprays the washing solution Q in order to prevent foreign substances from adhering to the flexographic printing plate precursor 70 at the surface of the washing solution Q in the developing tank 13. It is preferable that the washing solution Q is supplied from the prerinsing nozzle 54 at a flow rate that disturbs the liquid level Qs of the washing solution Q in the developing tank 13.

In the developing tank 13, residues generated through development float on the liquid level Qs of the washing solution Q in the developing tank 13. In a case where the residues adhere to the front surface 70a and the back surface 70b of the flexographic printing plate precursor 70, a defect is caused. There are also residues which are too small to be removed by the supply unit 22, and a defect is caused in a case where the residues adhere. By providing the prerinsing nozzle 54, the small residues are prevented from adhering, and the cleanliness of the front surface 70a of the flexographic printing plate precursor 70 can be increased.

Figure 23:
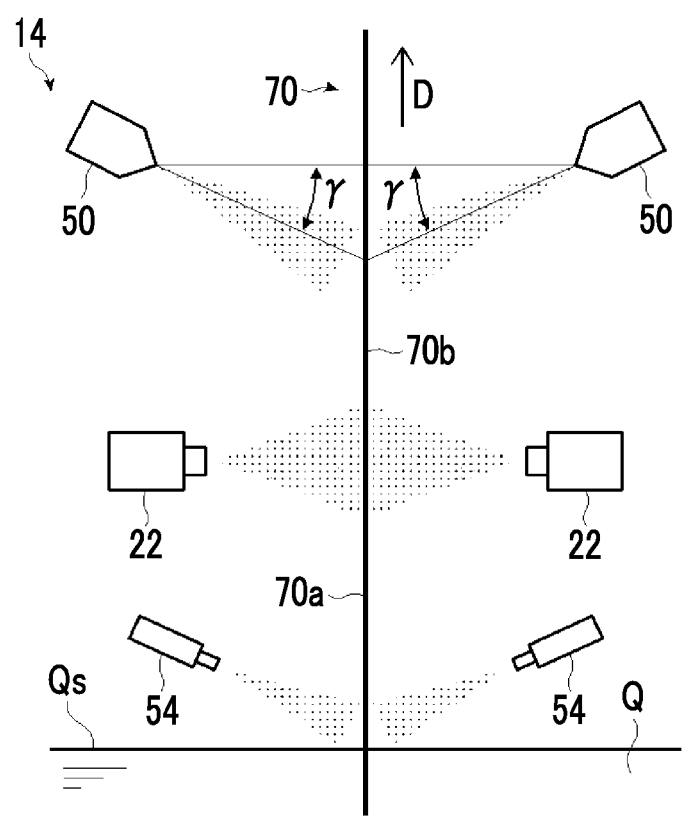
FIG. 23 is a schematic view showing a sixth example of the rinsing unit of the washing device of the embodiment of the present invention.

In addition, as shown in FIG. 23, a configuration where the supply units 22, the liquid drain nozzles 50, and the prerinsing nozzles 54 are provided at symmetrical positions with the flexographic printing plate precursor 70 interposed therebetween may be adopted. Accordingly, the small residues can be prevented from adhering to both surfaces of the flexographic printing plate precursor 70, and the cleanliness of both surfaces of the flexographic printing plate precursor 70 can be increased.

Figure 24:
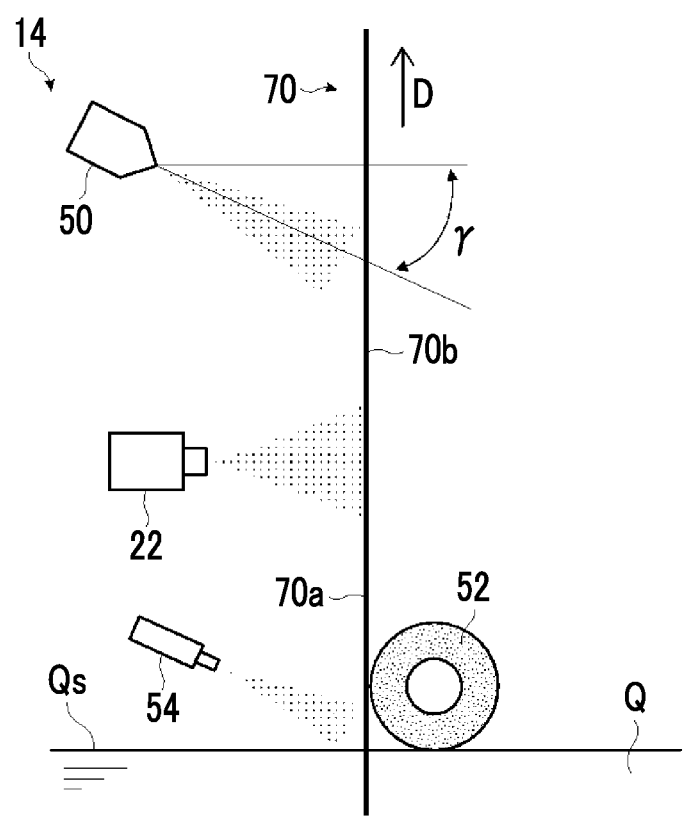
FIG. 24 is a schematic view showing a seventh example of the rinsing unit of the washing device of the embodiment of the present invention.

In addition, as shown in FIG. 24, a configuration where the brush 52 in contact with the back surface 70b of the flexographic printing plate precursor 70 is provided may be adopted in addition to the configuration shown in FIG. 22. Accordingly, in a case where the flexographic printing plate precursor 70 is transported, the brush 52 rotates in a state of being in contact with the back surface 70b, and residues such as latex components and rubber components remaining on the back surface 70b of the flexographic printing plate precursor 70 can be removed. Further, the residues that are not completely removed by the brush 52 can also be removed by the supply unit 22 and the liquid drain nozzle 50.

Figure 25:
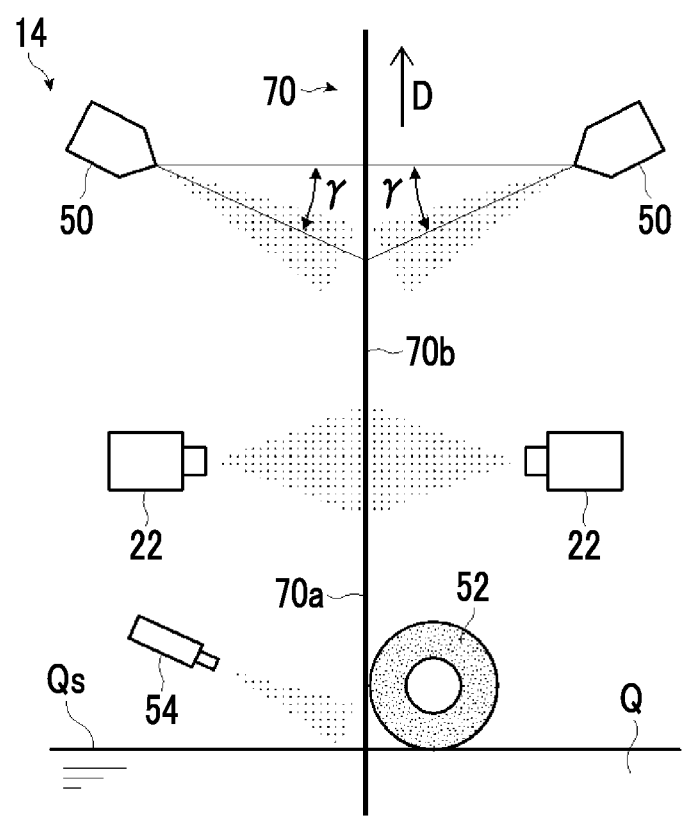
FIG. 25 is a schematic view showing an eighth example of the rinsing unit of the washing device of the embodiment of the present invention.

In addition, as shown in FIG. 25, a configuration where the brush 52 in contact with the back surface 70b of the flexographic printing plate precursor 70 is provided and the supply unit 22 and the liquid drain nozzle 50 are provided to face the back surface 70b at symmetrical positions with the flexographic printing plate precursor 70 interposed may be adopted in addition to the configuration shown in FIG. 22. Accordingly, in a case where the flexographic printing plate precursor 70 is transported, the brush 52 rotates in a state of being in contact with the back surface 70b, and residues such as latex components and rubber components remaining on the back surface 70b of the flexographic printing plate precursor 70 can be removed. Further, the residues that are not completely removed by the brush 52 can also be removed by the supply unit 22 and the liquid drain nozzle 50.

Although the brush 52 is disposed in contact with the liquid level Qs of the washing solution Q in FIGS. 24 and 25, without being limited thereto, the brush 52 may be disposed in state of being immersed in the washing solution Q.

In addition, the liquid drain nozzle 50 is inclined with respect to the transport direction D of the flexographic printing plate precursor 70, but in addition thereto, may be disposed to be inclined, for example, with respect to the direction DL (see FIG. 3). By making the liquid drain nozzle 50 inclined with respect to the direction DL, the washing solution Q can be collected on one side and be drained out. That is, the washing solution Q can be collectively removed on one side.

Although the transporting unit 11 described above, which adopts a winding transmission method in which the gear 30 and the transport chain 31 are used, is described as an example, the transporting unit 11 is not limited thereto. For example, the gear 30 may be changed to a pulley, and the transport chain 31 may be changed to a transport belt. The flexographic printing plate precursor is transported by using a pair of transport belts and fixing each transport belt to the leader.

In a case of using the transport belts, the transport belts hang parallel to each other. The transport belts are also not particularly limited, and flat belts, V-belts, rib belts, round belts, and toothed belts can be used.

In addition to the above, the transporting unit 11 can use, for example, a winding method of winding a traction member provided at the leader.

In a case of the winding method described above, for example, the traction member (not shown) for transporting the flexographic printing plate precursor 70 is attached to the leader for the flexographic printing plate precursor 70, and the flexographic printing plate precursor 70 is transported along the transport path Dp described above by winding the traction member. The traction member may be a string or may be a strip-shaped member.

The flexographic printing plate precursor 70 forms a flexographic printing plate used in flexographic printing, and the configuration thereof is not particularly limited. The flexographic printing plate precursor 70 is as thin as several millimeters, and has flexibility. Having flexibility means returning from a bent state caused by an acting force to the original state after unloading the force. The size of the flexographic printing plate precursor 70 is, for example, 800 mm×1,200 mm, and 1,050 mm×1,500 mm. Since development is performed by moving the brush 41, it is also possible to respond to the large flexographic printing plate precursor 70.

It is preferable that the flexographic printing plate precursor 70 is a flexographic printing plate precursor that can be developed with an aqueous developer of which a main component is water and flexographic printing plate precursor that is called a water-developing type flexographic printing plate precursor. In this case, the washing solution is the aqueous developer.

A known flexographic printing plate precursor that can be developed with the aqueous developer can be used as the flexographic printing plate precursor 70, and a flexographic plate material for computer to plate (CTP) having a surface to which a black layer is applied may be used as the flexographic printing plate precursor 70.

Hereinafter, the washing solution will be described.

<Washing Solution>

The washing solution is preferably a water-based washing solution, may be a solution consists of only water, and may be an aqueous solution which contains 50% by mass or more of water and to which a water soluble compound is added. Examples of the water soluble compound include surfactants, acids, and alkalis. The water-based washing solution described above corresponds to the aqueous developer.

Examples of the surfactant include anionic surfactants, nonionic surfactants, cationic surfactants, and amphoteric surfactants, and among the surfactants, anionic surfactants are preferable.

Specific examples of the anionic surfactant include aliphatic carboxylates such as sodium laurate and sodium oleate; higher alcohol sulfate ester salts such as sodium lauryl sulfate, sodium cetyl sulfate, and sodium oleyl sulfate; polyoxyethylene alkyl ether sulfates such as sodium polyoxyethylene lauryl ether sulfate; polyoxyethylene alkyl allyl ether sulfates such as sodium polyoxyethylene octylphenyl ether sulfate and sodium polyoxyethylene nonylphenyl ether sulfate; alkyl sulfonates such as alkyldiphenyl ether disulfonate, sodium dodecyl sulfonate, and sodium dialkyl sulfosuccinate; alkyl allyl sulfonates such as alkyl disulfonate, sodium dodecylbenzene sulfonate, sodium dibutylnaphthalene sulfonate, and sodium triisopropylnaphthalene sulfonate; higher alcohol phosphate ester salts such as lauryl phosphate monoester disodium and sodium lauryl phosphate diester; polyoxyethylene alkyl ether phosphoric acid ester salts such as polyoxyethylene lauryl ether phosphoric acid monoester disodium and polyoxyethylene lauryl ether phosphoric acid diester sodium. These may be used alone or may be used in combination of two or more types. Although a sodium salt is given as a specific example, it is not particularly limited to the sodium salt, and the same effect can be obtained with a calcium salt, an ammonia salt, or the like.

Specific examples of the nonionic surfactant include polyoxyethylene alkyl ethers such as polyoxyethylene oleyl ether and polyoxyethylene lauryl ether, polyoxyethylene polyoxypropylene glycols including polyoxyethylene alkyl phenyl ethers such as polyoxyethylene nonylphenyl ether and polyoxyethylene octylphenyl ether, mono and diesters of polyethylene glycol and fatty acids such as polyethylene glycol monostearate, polyethylene glycol monooleate, and polyethylene glycol dilaurate, fatty acids and sorbitan esters such as sorbitan monolaurate and sorbitan monooleate, esters of sorbitan polyoxyethylene adducts and fatty acids such as polyoxyethylene sorbitan monolaurate, polyoxyethylene sorbitan monostearate, and polyoxyethylene sorbitan trilaurate, esters fatty acids and sorbitol such as sorbitol monopalmitate and sorbitol dilaurate, esters of sorbitol polyoxyethylene adducts and fatty acids such as polyoxyethylene sorbitol monostearate and polyoxyethylene sorbitol diolate, esters of fatty acids and pentaerythritol such as pentaerythritol monostearate, esters of fatty acids and glycerin such as glycerin monolaurate, fatty acid alkanolamides such as lauric acid diethanolamide and lauric acid monoethanolamide, amine oxides such as lauryl dimethylamine oxide, fatty acid alkanolamines such as stearyl diethanolamine, polyoxyethylene alkylamines, triethanolamine fatty acid esters, alkaline salt compounds such as phosphates, carbonates, and silicates. These may be used alone or may be used in combination of two or more types.

Specific examples of the cationic surfactant include primary, secondary and tertiary amine salts such as monostearylammonium chloride, distearylammonium chloride, and tristearylammonium chloride, quaternary ammonium salts such as stearyltrimethylammonium chloride, distearyldimethylammonium chloride, and stearyldimethylbenzylammonium chloride, alkylpyridinium salts such as N-cetylpyridinium chloride and N-stearylpyridinium chloride, N, N-dialkyl morpholinium salts, fatty acid amide salts of polyethylene polyamines, acetic acids of urea compounds of amides of aminoethylethanolamine and stearic acid, and 2-alkyl-1-hydroxyethylimidazolinium chloride. These may be used alone or may be used in combination of two or more types.

Specific examples of the amphoteric surfactant include amino acid types such as sodium lauryl aminopropionate, carboxybetaine types such as lauryldimethylbetaine and lauryldihydroxyethylbetaine, sulfobetaine types such as stearyldimethylsulfoethyleneammonium betaine, imidazolenium betaine types, and lecithin. These may be used alone or may be used in combination of two or more types.

Specific examples of the acid include inorganic acids or organic acids such as hydrochloric acid, sulfuric acid, nitric acid, phosphoric acid, formic acid, acetic acid, oxalic acid, succinic acid, citric acid, malic acid, maleic acid, and paratoluenesulfonic acid.

Specific examples of the alkali include lithium hydroxide, sodium hydroxide, magnesium hydroxide, potassium hydroxide, calcium hydroxide, calcium oxide, sodium carbonate, sodium hydrogencarbonate, and calcium carbonate.

Hereinafter, the fatiqued developer will be described in detail.

<Fatiqued Developer>

The fatiqued developer is not particularly limited insofar as the fatiqued developer is a washing solution containing solid substances generated by removing the unexposed portion of the flexographic printing plate precursor due to development using the washing solution described above, that is, a washing solution containing an uncured resin. However, a fatiqued developer containing a known photosensitive resin composition of the related art for forming a general photosensitive resin layer may be included.

The uncured resin removed through development may be a photosensitive resin contained in the photosensitive resin composition.

In addition, since it is preferable to set a fatiqued developer in a case of developing under a laser ablation masking (LAM) method as a processing target, it is preferable that the uncured resin removed through development is the photosensitive resin contained in the photosensitive resin composition.

In addition, since examples of such a photosensitive resin composition include a composition containing a polymerization initiator, a polymerizable compound, a polymerization inhibitor, and a plasticizer, in addition to the photosensitive resin, the fatiqued developer may contain a polymerization initiator, a polymerizable compound, a polymerization inhibitor, a plasticizer, and the like, in addition to the uncured resin.

<Uncured Resin>

The uncured resin contained in the fatiqued developer is solid substances generated by removing the unexposed portion. Examples of the uncured resin contained in the fatiqued developer include water-dispersible latex, rubber components, polymer components, and uncrosslinked ethylenically unsaturated compounds (polymers).

Examples of the water-dispersible latex include water-dispersed latex polymers including water-dispersed latex such as polybutadiene latex, natural rubber latex, styrene-butadiene copolymer latex, acrylonitrile-butadiene copolymer latex, polychloroprene latex, polyisoprene latex, polyurethane latex, methyl methacrylate-butadiene copolymer latex, vinyl pyridine copolymer latex, butyl polymer latex, thiocol polymer latex, and acrylate polymer latex and polymers obtained by copolymerizing these polymers with other components such as acrylic acid or methacrylic acid.

Examples of the rubber component include butadiene rubber, isoprene rubber, styrene-butadiene rubber, acrylonitrile rubber, acrylonitrile butadiene rubber, chloroprene rubber, polyurethane rubber, silicon rubber, butyl rubber, ethylene-propylene rubber, and epichlorohydrin rubber.

The polymer component may be hydrophilic or may be hydrophobic, and specific examples thereof include a polyamide resin, an unsaturated polyester resin, an acrylic resin, a polyurethane resin, a polyester resin, and polyvinyl alcohol resin.

The solid substances having a specific gravity lower than the washing solution are, for example, photosensitive resins such as rubber components and latex.

The solid substances having a specific gravity higher than the washing solution are, for example, components of overcoat layers such as carbon.

Examples of the ethylenically unsaturated compound (polymer) include (meth) acrylic modified polymers having an ethylenically unsaturated bond in the molecule.

Examples of the (meth) acrylic modified polymer include (meth) acrylic modified butadiene rubber and (meth) acrylic-modified nitrile rubber.

"(Meth) acrylic" is a notation representing acrylic or methacrylic, and "(meth) acrylate" to be described later is a notation representing acrylate or methacrylate.

The uncured resin contained in the fatiqued developer is not particularly limited, but is preferably 70% by mass or less, and more preferably 35% by mass or less.

<Polymerization Initiator>

The polymerization initiator that may be contained in the fatiqued developer is preferably a photopolymerization initiator.

Examples of the photopolymerization initiator described above include alkylphenones, acetophenones, benzoin ethers, benzophenones, thioxanthones, anthraquinones, benzyls, and biacetyls, and among them, alkylphenones are preferable.

Specific examples of the alkylphenones photopolymerization initiators include 2,2-dimethoxy-1,2-diphenylethane-1-one, 1-hydroxy-cyclohexyl-phenyl-ketone, and 2-hydroxy-2-methyl-1-phenyl-propane-1-one.

The concentration of the polymerization initiator that may be contained in the fatiqued developer is not particularly limited, but is preferably 2.0% by mass or less, and more preferably 1.0% by mass or less.

<Polymerizable Compound>

Examples of the polymerizable compound that may be contained in the fatiqued developer include ethylenically unsaturated compounds that correspond to so-called monomer components other than the ethylenically unsaturated compounds (polymers) described above.

The ethylenically unsaturated compound may be a compound having one ethylenically unsaturated bond or may be a compound having two or more ethylenically unsaturated bonds.

Specific examples of the compound having one ethylenically unsaturated bond include (meth) acrylate having a hydroxyl group such as 2-hydroxyethyl (meth) acrylate, 2-hydroxypropyl (meth) acrylate, 2-hydroxybutyl (meth) acrylate, 3-chloro-2-hydroxypropyl (meth) acrylate, and β-hydroxy-β'-(meth) acryloyloxyethyl phthalate; alkyl (meth) acrylates such as methyl (meth) acrylate, ethyl (meth) acrylate, propyl (meth) acrylate, butyl (meth) acrylate, isoamyl (meth) acrylate, 2-ethylhexyl (meth) acrylate, lauryl (meth) acrylate, and stearyl (meth) acrylate; cycloalkyl (meth) acrylates such as cyclohexyl (meth) acrylate; alkylate halogenated (meth) acrylates such as chloroethyl (meth) acrylate and chloropropyl (meth) acrylate; alkoxyalkyl (meth) acrylates such as methoxyethyl (meth) acrylate, ethoxyethyl (meth) acrylate, and butoxyethyl (meth) acrylate; phenoxyalkyl (meth) acrylates such as phenoxyethyl acrylate and nonylphenoxyethyl (meth) acrylate; alkoxyalkylene glycol (meth) acrylates such as ethoxydiethylene glycol (meth) acrylate, methoxytriethylene glycol (meth) acrylate, and methoxydipropylene grecol (meth) acrylate; 2,2-dimethylaminoethyl (meth) acrylate, 2,2-diethylaminoethyl (meth) acrylate, 2-hydroxyethyl (meth) acrylate, and 3-chloro-2-hydroxypropyl (meth) acrylate.

Specific examples of the ethylenically unsaturated compound having two or more ethylenically unsaturated bonds include alkyldiol di (meth) acrylates such as 1,9-nonane diol di (meth) acrylate; polyethylene glycol di (meth) acrylates such as diethylene glycol di (meth) acrylate; polypropylene glycol di (meth) acrylates such as dipropylene glycol di (meth) acrylate; polyvalent (meth) acrylates obtained by addition reaction of a compound having an ethylenically unsaturated bond, such as unsaturated carboxylic acid and unsaturated alcohol, and active hydrogen with trimethylolpropane tri (meth) acrylate, pentaerythritol tri (meth) acrylate, pentaerythritol tetra (meth) acrylate, glycerol tri (meth) acrylate, and ethylene glycol diglycidyl ether; polyvalent (meth) acrylates obtained by addition reaction of an unsaturated epoxy compound such as glycidyl (meth) acrylate with a compound having active hydrogen such as carboxylic acid and amine; polyvalent (meth) acrylamides such as methylenebis (meth) acrylamide; polyvalent vinyl compounds such as divinylbenzene.

The concentration of the polymerizable compound that may be contained in the fatiqued developer is not particularly limited, but is preferably 30.0% by mass or less, and more preferably 15.0% by mass or less.

<Polymerization Inhibitor>

Specific examples of the polymerization inhibitor that may be contained in the fatiqued developer include hydroquinone monomethyl ether, p-methoxyphenol, di-t-butyl-p-cresol, pyrogallol, t-butylcatechol, benzoquinone, 4,4'-thiobis (3-methyl-6-t-butylphenol), 2,2-methylenebis (4-methyl-6-t-butylphenol), and N-nitrosophenylhydroxyamine first cerium salt.

The concentration of the polymerization inhibitor that may be contained in the fatiqued developer is not particularly limited, but is preferably 0.3% by mass or less, and more preferably 0.15% by mass or less.

<Plasticizer>

Examples of the plasticizer that may be contained in the fatiqued developer include liquid rubber, oil, polyester, and phosphoric acid-based compounds.

Specific examples of the liquid rubber include liquid polybutadiene, liquid polyisoprene, and those modified with maleic acid or an epoxy group.

Specific examples of the oil include paraffin oil, naphthenic oil, and aroma oil.

Specific examples of the polyester include adipic acid-based polyester.

Specific examples of the phosphoric acid-based compound include phosphoric acid ester.

The concentration of the plasticizer that may be contained in the fatiqued developer is not particularly limited, but is preferably 30% by mass or less, and more preferably 15% by mass or less.

The present invention is basically configured as described above. Although the washing device of the embodiment of the present invention has been described in detail hereinbefore, the present invention is not limited to the embodiment described above, and it is evident that various improvements or changes may be made without departing from the gist of the present invention.

EXPLANATION OF REFERENCES

10: washing device
11: transporting unit
12: developing portion
13: developing tank
14: rinsing unit
15: frame
15a: member
15b: beam member
17: connecting pipe
18: processing unit
19: saucer
20: pipe
21: rinsing liquid supply unit
21a: supply pipe
21b: valve
22: supply unit
23: solid substance
24: separation membrane
26: driving unit
27: driving shaft portion
29, 29b: pulley
29a: transmission belt
30: gear
30a: shaft 31: transport chain
31b: fixing unit
32: transport driving unit
33: tension adjusting unit
34: guide unit
35: back plate portion
36: nip roller
37: front end leader
37a, 38a: base
37b, 38b: bending portion
37c, 38c: pin
38: rear end leader
39: leader mechanism
39a: frame material
39b, 88, 89, 94: elastic member
40: developing unit
41, 52: brush
41a: substrate
41b: bristle
41c: front end surface
42: guide roller
45: rotation shaft portion
45a: rotation shaft portion
46: supply unit
47: supply pipe
48: support
48a: front end part
48b: rear end part
49: tape
50: liquid drain nozzle
54: prerinsing nozzle
70: flexographic printing plate precursor
70a: front surface
70b: back surface
70c: front end
70d: rear end
80, 81: shaft joint portion
82: first member
84: second member
85: ball
86: first flange
87: second flange
90: pressing unit
92: case
95: fixing wall
C: rotation axis
D: transport direction
$D_1$: first moving direction
$D_2$: second moving direction
DL: direction
Dc: drive shaft
Dp: transport path
Dpc: curved transport passage
Dps: linear transport passage
Q: washing solution
Qs: liquid level
Qw: fatiqued developer
r rotation direction
γ: nozzle angle
θ: angle

What is claimed is:

1. A washing device that performs development using a washing solution while transporting an imagewise exposed flexographic printing plate precursor, the washing device comprising:
 a transporting unit that transports the flexographic printing plate precursor along a go-around transport path having a curved transport passage and a linear transport passage, using a leader; and
 a developing portion that performs the development by removing an unexposed portion of the flexographic printing plate precursor,
 wherein the leader is provided at, among a front end of the flexographic printing plate precursor on a traveling direction side and a rear end on an opposite side of the front end, at least the front end, and
 wherein the transporting unit transports the flexographic printing plate precursor using a method of winding a traction member provided at the leader, and
 wherein the transporting unit uses a pair of transport chains or a pair of transport belts disposed parallel to each other, fixes the leader to the transport chains or the transport belts, and transports the flexographic printing plate precursor.

2. The washing device according to claim 1,
 wherein the leader is provided, among a front end part of a support where the flexographic printing plate precursor is provided on a traveling direction side and a rear end part on an opposite side of the front end part, at at least the front end part.

3. The washing device according to claim 2,
 wherein the leader is provided at each of the front end part of the support and the rear end part of the support.

4. The washing device according to claim 1,
 wherein the leader has a leader mechanism that expands and contracts in a traveling direction of the flexographic printing plate precursor.

5. The washing device according to claim 1, wherein the leader is fixed to the transport chains or the transport belts through at least one method of fixing methods using hooking, screwing, sandwiching, or a magnetic force.

6. The washing device according to claim 1,
 wherein the transporting unit has a tension adjusting unit that adjusts tension of the flexographic printing plate precursor during transporting.

7. The washing device according to claim 1,
 wherein a guide unit that is in contact with the flexographic printing plate precursor is provided at the curved transport passage, and at least a surface of the guide unit, which is in contact with the flexographic printing plate precursor, is composed of a resin layer, a plating layer, or a diamond-like carbon layer or is formed of a plurality of uneven portions.

8. The washing device according to claim 1,
 wherein a back plate portion that is in contact with the flexographic printing plate precursor is provided at the linear transport passage, and a surface of the back plate portion, which is in contact with the flexographic printing plate precursor, is a plane.

9. The washing device according to claim 1,
 wherein the transporting unit has a guide mechanism that guides the transport chains.

10. The washing device according to claim 1,
 wherein the developing portion performs development by immersing the flexographic printing plate precursor in the washing solution or supplying the washing solution to the flexographic printing plate precursor.

11. The washing device according to claim 1,
 wherein the washing solution is an aqueous developer.

12. The washing device according to claim 1, further comprising:
 a rinsing unit that is provided on a downstream side of the developing portion in a traveling direction of the flexographic printing plate precursor, wherein the rinsing unit supplies at least the washing solution to a surface of the flexographic printing plate precursor from which the unexposed portion of the flexographic printing plate precursor is removed.

13. The washing device according to claim 12,
wherein the rinsing unit supplies the washing solution to a back surface of the flexographic printing plate precursor.

14. The washing device according to claim 13,
wherein the rinsing unit has
   a nozzle that is for supplying the washing solution, and
   a liquid drain nozzle that is provided on the traveling direction side of the flexographic printing plate precursor from the nozzle, and removes the washing solution supplied from the nozzle by jetting or sucking a gas.

15. The washing device according to claim 1,
wherein the leader has a leader mechanism that expands and contracts in a traveling direction of the flexographic printing plate precursor.

16. The washing device according to claim 1,
wherein the leader is fixed to the transport chains or the transport belts through at least one method of fixing methods using hooking, screwing, sandwiching, or a magnetic force.

17. The washing device according to claim 1,
wherein the transporting unit has a tension adjusting unit that adjusts tension of the flexographic printing plate precursor during transporting.

* * * * *